US005557501A

United States Patent [19]
DiStefano et al.

[11] Patent Number: 5,557,501
[45] Date of Patent: Sep. 17, 1996

[54] COMPLIANT THERMAL CONNECTORS AND ASSEMBLIES INCORPORATING THE SAME

[75] Inventors: Thomas H. DiStefano, Monte Sereno; John W. Smith, Palo Alto, both of Calif.

[73] Assignee: Tessera, Inc., San Jose, Calif.

[21] Appl. No.: 342,222

[22] Filed: Nov. 18, 1994

[51] Int. Cl.⁶ ................................................. H05K 7/20
[52] U.S. Cl. ...................... 361/704; 165/185; 174/16.3; 257/713; 257/719
[58] Field of Search .................................. 165/80.2–80.4, 165/185; 174/16.3; 361/688, 699, 702–704, 707–722; 257/707, 712–713, 718–719, 726–727; 267/150, 160

[56] References Cited

U.S. PATENT DOCUMENTS

| | | |
|---|---|---|
| 4,156,458 | 5/1979 | Chu et al. . |
| 4,415,025 | 11/1983 | Hovath et al. . |
| 4,485,429 | 11/1984 | Mittal . |
| 4,654,754 | 3/1987 | Daszkowski . |
| 4,689,720 | 8/1987 | Daszkowski . |
| 4,849,856 | 7/1989 | Funari et al. . |
| 4,858,072 | 8/1989 | Chall, Jr. . |
| 4,993,482 | 2/1991 | Dobear et al. . |
| 4,996,589 | 2/1991 | Kajiwara et al. . |
| 5,014,117 | 5/1991 | Horvath et al. . |
| 5,025,307 | 6/1991 | Ueda et al. . |
| 5,052,481 | 10/1991 | Horvath et al. . |
| 5,150,274 | 9/1992 | Okada et al. . |
| 5,159,531 | 10/1992 | Hovath et al. . |
| 5,168,926 | 12/1992 | Watson et al. . |
| 5,206,792 | 4/1993 | Reynolds . |
| 5,270,902 | 12/1993 | Bellar et al. . |
| 5,325,265 | 6/1994 | Turlik et al. . |

OTHER PUBLICATIONS

Multichip Module Technologies and Alternatives: The Basics, Chapter 12, pp. 569–613, "Thermal Design Considerations For Multichip Module Applications" Date unknown.
System Cooling Design For the Water–Cooled IBM Enterprise System/9000 Processors, IBM J. Res. Develop., vol. 36, No. 4, Jul. 1992.
Structural Honeycomb Materials For Advanced Aerospace Designs, Mar. 1990.
Microelectronics Packaging Handbook, Chapter 4, pp. 167–223, "Heat Transfer In Electronic Packages" Date unknown.
IBM Tech. Disclosure Bulletin "Self–Loaded Plates For Chip Cooling", vol. 32, No. 1, Jun. 1989, p. 151.
IBM Tech. Disclosure Bulletin "New Coating For Radial Finger Cooling", vol. 28, No. 12, May 1986, pp. 5504–5505.

Primary Examiner—Gregory D. Thompson
Attorney, Agent, or Firm—Lerner, David, Littenberg, Krumholz & Mentlik

[57] ABSTRACT

A thermal connector for conducting heat from microelectronic components such as semiconductor chips to a heat sink. The connector includes a large number of flexible thermal conductors desirably formed as elongated "S"-shaped strips or ribbons. The conductors can flex to accommodate tolerances in the assembly and displacement of the components caused by thermal expansion. The conductors may have relatively thin neck sections to increase the flexibility of the conductors, The connector may be fabricated by a process which includes fabrication of the conductors as flat strips, bonding of the conductors to a pair of opposed planar sheets and vertically moving the sheets away from one another to expand the conductors vertically to their final three-dimensional configuration.

24 Claims, 12 Drawing Sheets

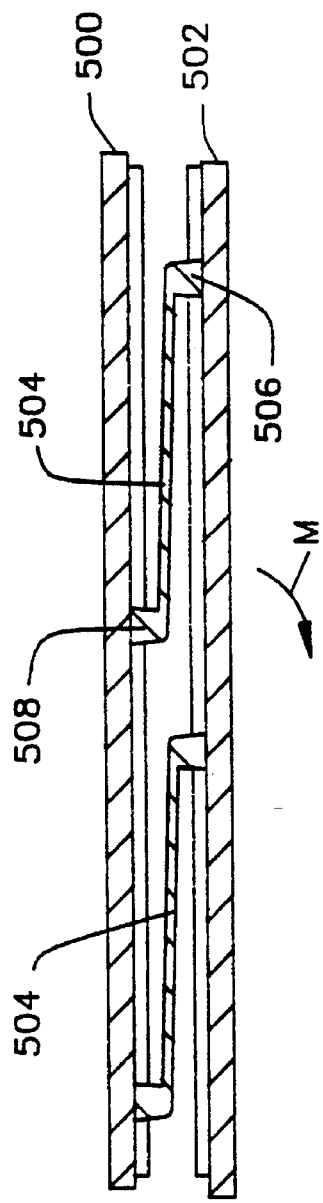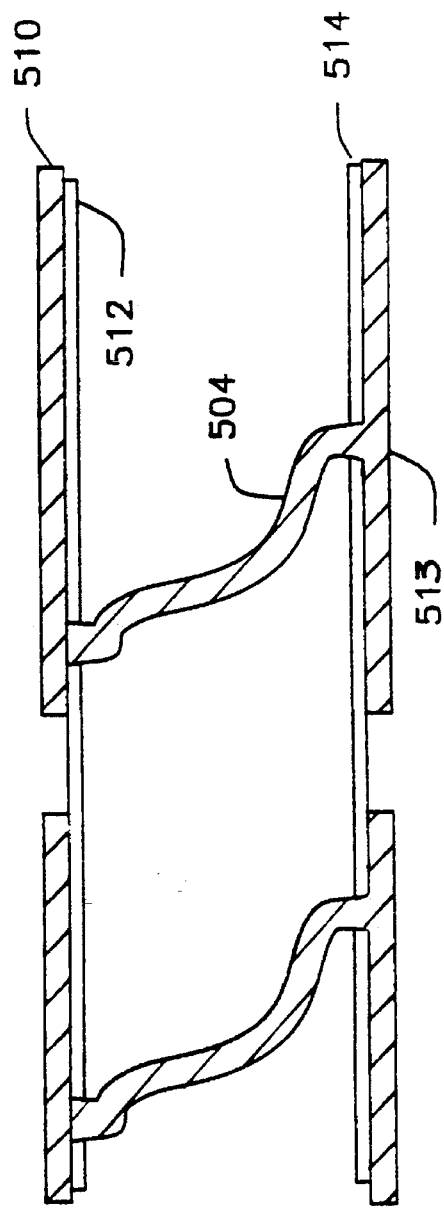
FIG. 18
FIG. 19

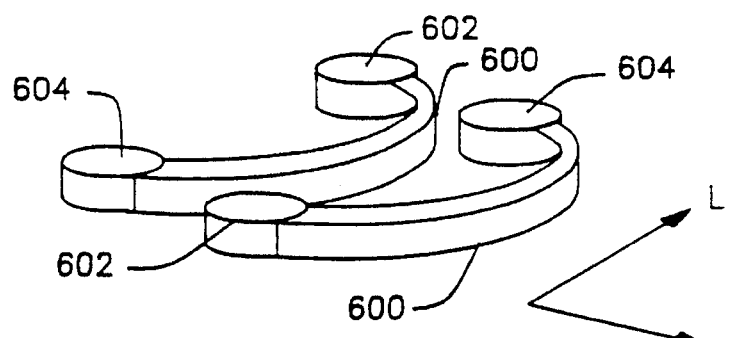
FIG. 20
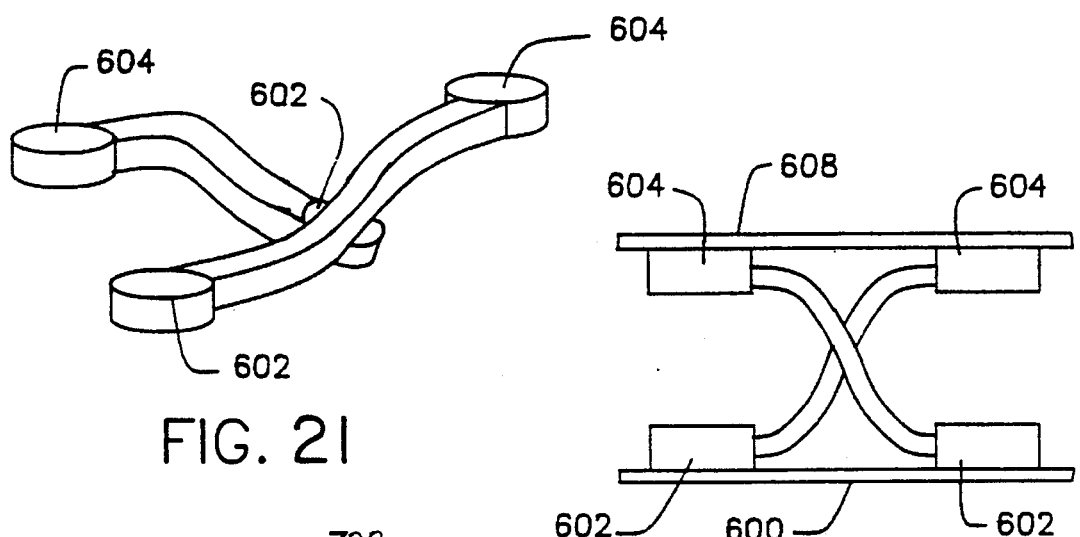
FIG. 21
FIG. 22
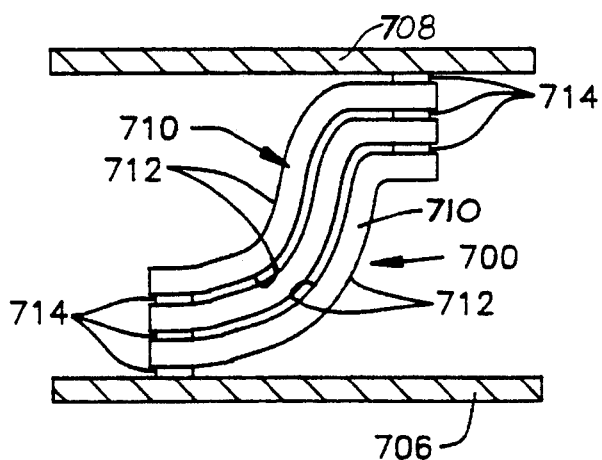
FIG. 23
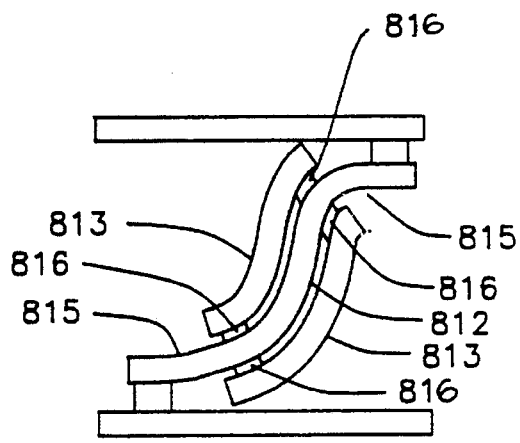
FIG. 24

COMPLIANT THERMAL CONNECTORS AND ASSEMBLIES INCORPORATING THE SAME

FIELD OF THE INVENTION

The present invention relates to the field of heat transfer devices for microelectronic elements, to microelectronic assemblies incorporating such heat transfer devices, and to methods of making and using such devices.

BACKGROUND OF THE INVENTION

Microelectronic elements such as semiconductor chips generate considerable amounts of heat during use. A complex, high-speed chip a few $cm^2$ in area may produce tens of watts of heat. This heat must be dissipated while maintaining the chip at a safe operating temperature. The heat dissipation problem is even more severe where chips and other components are closely packed in assemblies commonly referred to as "multi-chip modules". Such modules typically incorporate one or more substrates with chips disposed close to one another on the substrate. Improvements in chip mountings and electrical connections, and in related assembly methods, have made it possible to reduce the distance between chips so as to achieve a more compact assembly. With sophisticated assembly techniques, it is possible to fill the entire area of the substrate with chips. The heat dissipation problem is particularly extreme in such compact multi-chip modules.

Considerable effort has been devoted in the art towards meeting these needs for cooling. A general outline of the approaches taken heretofore is set forth in the text Multichip Module Technologies and Alternatives—The Basics, Doane, D. A. and Franzon, P. D., EDS 1993 Van Nostrand Reinhold, New York, N.Y. at chapter 12, pp. 569–613, entitled "Thermal Design Considerations For Multichip Module Applications" (Azar, K., chapter author) and at pages 109–111 of the same reference. As described therein, heat transfer problems in electronic packaging can be addressed in terms of "thermal resistance" of the elements involved. The thermal resistance of any element in the heat transfer path refers to the ratio between the temperature difference across such element and the rate of heat flow through the element. Thermal insulators have high thermal resistance whereas elements which convey heat effectively by conduction or convection have low thermal resistance. The overall thermal resistance of the package is the sum of the individual thermal resistances in series in the heat path between the chip and the ambient environment. The overall thermal resistance in turn provides a ratio between the temperature rise of the chips above ambient temperature and the amount of heat produced in the chips.

As described in the aforementioned reference, the heat conduction pathway may include an element commonly referred to as a "heat sink". There is normally a low thermal resistance connection from the heat sink to the environment. For example, the vanes of the heat sink may be bathed in a flow of forced air or liquid. However, there is generally an appreciable thermal resistance between the chips or after microelectronic components and the heat sink. Stated another way, it is difficult to provide a low thermal resistance connection between the chips, or a subassembly including the chips, and the heat sink while still meeting all of the other requirements for such a connection. The thermal connection must accommodate relative movement between the chips or other components and the heat sink during use of the device. Such relative movement arises in part from movement of the components and the substrate bearing the components as the assembly undergoes temperature changes during use. When the unit is first supplied with power, the temperature of the chips or other components and the substrate rises faster than the temperature of the substrate, causing differential thermal expansion, warpage and distortion. Further, the coefficients of thermal expansion of the chips and the substrate normally are not matched with the coefficient thermal expansion of the heat sink, causing further differential thermal expansion and contraction. Mechanical stresses imposed upon the assembly during handling and installation can cause additional relative movement.

Moreover, the connection between the components and the heat sink should accommodate dimensional tolerances in the components, the substrate and the heat sink itself. For example, the chips themselves may be of different thicknesses. Also, the chips can be supported at different levels above the face of the substrate by solder balls or other mountings. The surfaces of the chips may be tilted from their nominal positions, so that the chip surfaces are out of alignment with the surface of the heat sink. The heat sink itself may not be perfectly flat or parallel to the nominal plane of the chip surfaces. Any elements used to connect the heat sink with the chip or the components should be capable of accommodating these tolerances and misalignments.

Daszkowski, U.S. Pat. Nos. 4,654,754 and 4,689,720 disclose a thermal link using either a metallic spring disposed between the heat sink and the active device or a thermally conductive elastomer which can be crushed between the heat sink and the device without exerting very high forces on the device.

Kajiwara et al, U.S. Pat. No. 4,996,589 discloses a module in which a liquid cooled heat sink is connected to a chip by a low melting solder, the sink itself being equipped with a bellows-like device to allow displacement of the heat sink so as to accommodate tolerances and misalignment.

Turlik et al, U.S. Pat. No. 5,325,265 discloses a multichip module in which chips are bonded to a ceramic support substrate having coefficient of thermal expansion matching that of the chip and the heat sink also has a matching coefficient of expansion. The exposed faces of the chips are connected to the heat sink by a "soft, thermally conductive mechanical cushion material", desirably a low-melting point indium material which is melted in place.

Okada et al, U.S. Pat. No. 5,150,274; Chall, Jr., U.S. Pat. No. 4,858,072 and Ueda et al, U.S. Pat. No. 5,025,307 all disclose chip assemblies using fluid-cooled heat sinks. Watson et al, U.S. Pat. No. 5,168,926 discloses a chip assembly in which a heat sink is attached to the chip carrier by a thermally conductive adhesive after the chip carrier is soldered to a larger circuit board.

Horvath et al, U.S. Pat. Nos. 5,052,481 and 5,014,117 disclose arrangements for connecting multiple chips to a common heat sink having a slotted face using mating slotted elements and flexible metallic elements attached to the chips and to the heat sinks or both. These elements interfit with one another to provide a thermal path between the chips and the heat sink.

Mittal, U.S. Pat. No. 4,485,429 describes a cooling arrangement in which bunches of heat conducting strands extend from chips to a housing which in turn is bathed in a fluid. The housing may have further strands attached to it to promote heat dissipation into the fluids. The strands are said to be flexible. Funari et al, U.S. Pat. No. 4,849,856 discloses a heat sink with flexible feet so that the heat sink can be forced downwardly against a chip without damaging the chip.

Chu et al, U.S. Pat. No. 4,156,458 discloses a multi-chip module incorporating bundles of metallic foils extending between the microelectronic element and the heat sink. The ends of the foils adjacent the microelectronic elements are "microsliced" or cut into thin, individual ribbons so that the same are "better able to flex and follow any minute contours of the chip surface and also slight tilt of the chip surface".

Dobear et al, U.S. Pat. No. 4,993,482 describes the use of thermally conductive coil springs disposed between the chip and the heat sink. Bellar et al, U.S. Pat. No. 5,270,902; Horvath, U.S. Pat. No. 4,415,025 and Horvath et al, U.S. Pat. No. 5,159,531 all disclose arrangements in which a dome-like sheet metal element with multiple cuts therein is disposed between each chip and the associated heat sink, or in which several such elements are nested within one another to provide multiple heat paths.

Reynolds, U.S. Pat. No. 5,206,792 describes a further sheet metal element for connecting a chip to a heat sink, the sheet metal element including numerous mechanically compliant fingers at its periphery.

Despite all of this effort in the art, further improvement in thermal conductive elements and in assemblies incorporating the same is still desired. In particular, it is difficult to achieve a low thermal resistance connection between the chip or other microelectronic element and the heat sink while still providing the required compliance to take up tolerances and movement due to thermal effects. Moreover, many of the prior solutions have required costly and failure-prone manufacturing steps.

SUMMARY OF THE INVENTION

The present invention addresses these needs.

One aspect of the present invention provides a thermal connector for a microelectronic assembly which includes a plurality of conductive paths. Each path incorporates one or more elongated conductors formed from a flexible but thermally conductive material, most preferably a metal. Each path has a proximal end and a distal end. The proximal and distal ends are spaced apart from one another in a vertical direction. The individual conductors can bend independently, and can accommodate non-uniform vertical positioning of the microelectronic devices relative to the heat sink. For example, where chips mounted to a common substrate have different thicknesses or are tilted with respect to the substrate, the resulting deviations from coplanarity of the chip surfaces can be accommodated readily. The conductors also provide compliance in the horizontal directions. That is, flexure of the conductors can accommodate horizontal movement of the chips or other microelectronic elements relative to the heat sink.

The conductors in the paths most preferably slope in first and second lengthwise, horizontal directions. For example, each conductor may be a generally flat strip. The conductors are arranged in one or more arrays extending in the lengthwise, horizontal directions and also extending in widthwise horizontal directions transverse to the lengthwise directions. Each such array preferably includes a substantially equal number of conductors sloping in each of the lengthwise directions. Each array may include a large number of conductors, disposed at relatively small spacings.

In use, the proximal ends of the conductive paths are connected directly or indirectly to the chips or other microelectronic devices, whereas the distal ends of the conductors are connected directly or indirectly to a heat sink. The flexible conductors can deform vertically under relatively small forces, as the connector is engaged between the microelectronic components and the heat sink. Because each array includes equal numbers of conductors sloping in both lengthwise directions, horizontal forces in the conductors produced by vertical movement of the proximal ends relative to the distal ends are substantially balanced, so that the conductors as a whole do not tend to displace the microelectronic components horizontally relative to the heat sink as the elements move towards and away from the heat sink.

The connector desirably includes a device side element, which may incorporate a plurality of individual device side pads, each such pad being movable independently of the other pads. Preferably, the pads are disposed in a grid extending in the horizontal directions. The pads desirably are flat and have major dimensions on the order of a few millimeters or less and most preferably about 1 mm or less. The pads may be connected to one another by a flexible sheet which permits independent movement in the vertical and horizontal directions. The proximal end of each conductive path is connected to one of the pads. Most preferably, the proximal ends of two conductors sloping in opposite lengthwise directions are connected to each pad, so that lengthwise forces on each pad induced by vertical movement are substantially balanced. The flexible sheet facilitates handling and assembly of the device. Further, the flexible sheet provides a seal between the individual pads. An encapsulant or a cooling fluid may be introduced between the device-side pads and each device surface. The connector may further include a similar sink-side element that may be divided into a plurality of sink-side pads, and may include a flexible sheet connecting these pads.

Each conductive path may include only one conductor extending from its proximal end to its distal end. Alternatively, each path may include a plurality of conductors connected substantially end-to-end so that conductors in each path slope alternately in the first and second lengthwise directions. That is, the connector includes two or more arrays of conductors, each array extending in the horizontal directions, the arrays being superposed upon one another in vertically stacked arrangement, with each conductor in the lowermost array being connected to a conductor of the next higher array. Each path includes conductors in all of the superposed arrays. The paths desirably include a plurality of paths of a first type in which a conductor at the proximal end slopes in the first lengthwise direction and the next conductor in the same path slopes in the second lengthwise direction, and a plurality of paths of a second type in which the conductor at the proximal ends slopes in the second lengthwise direction and the next conductor slopes in the first lengthwise direction. The number of paths of the first and second types desirably are substantially equal to one another. Preferably, the conductors are elongated, thermally conductive strips having major faces directed generally in the vertical directions. The strips preferably are curved when the connector is in a neutral or unloaded condition. Each conductor preferably includes one or more generally S-shaped parts, each such part being formed from a flat strip bent transverse to the plane of the strip. Each such S-shaped part may include a curved portion or crest at each end of the part and a sloping middle portion.

A thermal connector in accordance with a further aspect of the invention includes a lower array of conductors, each such conductor including an elongated thermally conductive strip having opposite major faces directed generally in vertical directions, each such conductor curving in the vertical directions so as to define a lower crest at which the strip extends substantially horizontally. The connector may further includes an upper array of conductors, each such conductor of the upper array including an elongated thermally conductive strip also having opposite major faces directed generally in the vertical directions. Each such upper array conductor also curves in the vertical direction and defines an upper crest at which the strip constituting the conductor extends substantially horizontally. The conductors of the lower array are thermally connected to the conductors of the upper array. Preferably, each conductor of the upper array is directly attached to at least one conductor of the lower array, so that the attached conductors define substantially continuous paths extending vertically through the connector.

The connectors of the upper and lower arrays may define medial crests disposed vertically between the upper and lower crests. The strips constituting the conductors of both arrays desirably extend horizontally and substantially tangentially to one another at the medial crests. The conductors of the upper and lower arrays may be attached to one another at the medial crest, with the strips constituting the attached conductors overlying one another in substantially face-to-face arrangement. The strips may be metallurgically bonded to one another, as by welding.

In one arrangement, each conductor of the upper array includes two generally S-shaped portions disposed back-to-back and joined to one another at a common upper crest. Each such conductor defines two medial crests and one upper crest between the medial crests. Each conductor of the lower array incorporates two generally S-shaped regions disposed back-to-back and joined to one another at a common lower crest. Thus, each lower conductor defines two medial crests and one lower crest between such medial crests. The two medial crests of each upper conductor may be attached to the two medial crests of the same lower conductor so that the upper and lower conductors together form a loop-like composite conductor having oppositely pointing upper and lower crests. The connector desirably includes a device-side element incorporating a plurality of independently movable pads, and the lower crest of at least one such composite conductor is attached to each pad.

In another arrangement, each conductor may include a single S-shaped strip and thus may include only one medial crest, each conductor of the upper array being connected to one conductor of the lower array to thereby form a composite conductor. Each such composite conductor includes one S-shaped conductor sloping generally in a first horizontal direction and another conductor sloping generally in the second, opposite lengthwise direction.

Connectors according to these aspects of the present invention provide compact arrangements of conductors which can be readily manufactured and assembled with chips or other components and with heat sinks. As further discussed hereinbelow, preferred connectors according to these aspects of the present invention can provide good compliance while still accommodating large numbers of conductors and providing high thermal conductivity in the vertical direction.

A further aspect of the invention provides a thermal connector including a plurality of elongated heat conductors formed from a thermally conductive material, preferably metal, each such elongated conductor having an axis of elongation. The conductors define a plurality of continuous paths, each path having a proximal end and a distal end. The conductors are arranged so that when the proximal ends of the conductors are connected to microelectronic components and the distal ends of the paths are connected to a heat sink, the conductors will be bent transverse to their axes of elongation upon relative movement of the components and heat sink. For example, the conductors may be arranged to form paths according to the configurations discussed above, or other configurations.

In a connector according to this aspect of the present invention, at least some of the conductors, and preferably all of the conductors, are necked conductors. Each necked conductor has a main region constituting a major portion of the length of the conductor and at least one neck, the neck constituting a minor portion of the length of the conductor. Each neck is more flexible in bending than the main region. Each neck typically has a cross-sectional area smaller than the main region of the conductor. The necks may be disposed adjacent to the ends of the conductors. Some or all of the necked conductors may have necks adjacent both ends. The conductors may be in the form of strips, each such conductor including a pair of oppositely facing major surfaces defining the thickness of the conductor and a pair of edges bounding these major surfaces defining the width of the conductor. Preferably, the conductors are arranged so that they are stressed in bending transverse to the major surfaces of the strips. Each neck region may have thickness smaller than the thickness of the main region of the conductor or, alternatively or additionally, may have a width smaller than the width of the main region. This aspect of the invention incorporates the realization that a relatively small, localized reduction in the cross-sectional area of the conductor, extending over a minor portion of the length of the conductor, only slightly reduces the overall thermal conductivity of the conductor and only slightly increases its thermal resistance, but dramatically reduces the stiffness of the conductor in bending. Stated another way, the necked conductors provide combinations of high compliance and low thermal resistance which are unobtainable using equivalent conductors of uniform cross-section.

A further aspect of the present invention provides methods of making thermal connectors. Methods according to this aspect of the present invention desirably include the steps of providing a plurality of elongated conductors, arranged in a plurality of paths, each such path having a proximal end and a distal end. Each such path includes one conductor or a plurality of conductors connected to one another. The proximal end of each path is connected to a device-side element and the distal end of each path is connected to a sink-side element. A method further includes the step of moving the device-side element and the sink-side element relative to one another to thereby deform the conductors in all of the paths simultaneously. Preferably, the moving step includes the step of moving the device side element and sink side element away from one another. The step of providing the conductors preferably includes the step of providing the conductors and paths in a substantially planar structure, such that the ends of the paths are attached to the device-side and sink-side elements while the device-side and the sink-side elements are close to one another. As these elements move away from one another, the planar conductors are expanded into a three dimensional structure. Preferably, the conductors constituting the paths are substantially in the form of strips, each such conductor having a pair of oppositely facing major surfaces defining the thickness of the conductor. The major surfaces of the conductors face toward the device-side element and the sink-side element, so that during the moving step, each conductor is bent transversely to its thickness, preferably into an S-shaped curve.

The device-side element desirably includes a first plate, and the method may further include the step of subdividing the first plate into a plurality of individual pads, each such pad being connected to the proximal end of at least one path. The subdividing step may be performed before or, preferably, after the moving step. The sink-side element may likewise initially include a plate, which may also be subdivided to form individual paths, each connected to the distal end of at least one path. The method may also include the step of providing a flexible sheet overlying the first plate prior to the step of subdividing it, so that the flexible sheet connects the pads to one another after the subdividing step. The first plate may have a proximal side facing away from the connectors and a distal side facing towards the connectors, the proximal ends of the paths being attached to the distal side of the first plate, and the step of providing the flexible layer may include the step of providing the flexible layer on the distal side of the first plate, such that each path is attached to the first plate through an opening in the flexible layer.

A further aspect of the present invention provides methods of forming a thermal connector including the step of providing a starting assemblage including a plurality of conductive paths, each path including one or more elongated, strip-like conductors having a pair of oppositely facing major surfaces defining the thickness of the conductor and a pair of edges defining the width of the conductor. Each path has a proximal and a distal end. The method further includes the step of moving all of the proximal ends of the conductors vertically downwardly and moving all of the distal ends vertically upwardly to thereby bend each conductor in directions transverse to its major surfaces. Each path may include a plurality of strip-like conductors initially in substantially face-to-face arrangement. The proximal and distal ends of each such path initially are superposed vertically and the conductors in each such path project from such superposed ends in lengthwise horizontal directions. That is, the joints between conductors of each path are offset in the lengthwise directions from the superposed proximal and distal ends. When the proximal and distal ends are moved vertically away from one another, the joint moves in the lengthwise horizontal direction towards the superposed ends.

The conductors may be provided in arrays which extend in the lengthwise directions and which also extend in the widthwise directions transverse to the lengthwise direction. When the proximal and distal ends are moved vertically, the array of conductors expands into a three-dimensional structure. The paths desirably are arranged so that the joints of neighboring paths are offset in opposite lengthwise directions from their respective proximal and distal ends. Thus, when the proximal and distal ends are moved vertically, the joints of neighboring paths move in opposite lengthwise directions. Preferably, the method includes the steps of forming or providing a plurality of device-side pads and attaching the proximal ends of the paths to such pads in pairs of oppositely oriented neighboring paths, so that each pad is connected to an equal number of oppositely oriented paths. This assures that the pads will not be subject to unbalanced lengthwise, horizontal forces during vertical movement in fabrication or in use.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIGS. 18 and 19 are fragmentary sectional views depicting a connector fabrication process in accordance with another embodiment of the invention.

FIGS. 20 and 21 are schematic perspective views depicting elements of a connector fabrication process in accordance with another embodiment of the invention.

FIG. 22 is a fragmentary elevational view of the connector made by the process of FIGS. 20–21.

FIGS. 23 and 24 are fragmentary elevational views similar to FIG. 22 but depicting connectors in accordance with further embodiments of the invention.

DETAILED DESCRIPTION OF THE PREFERRED EMBODIMENT

Figure 1:
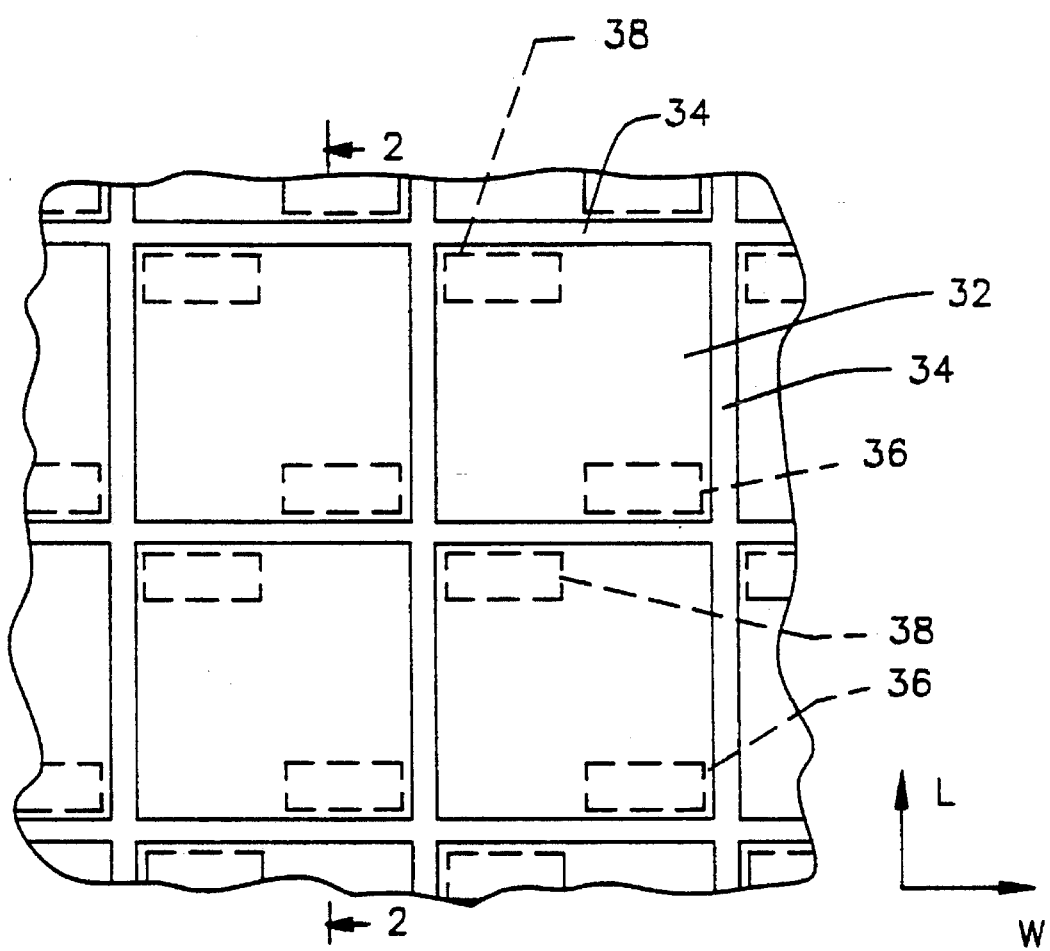
FIG. 1 is a diagrammatic, fragmentary plan view showing components during one portion of a fabrication process in accordance with an embodiment of the invention.
Figure 2:
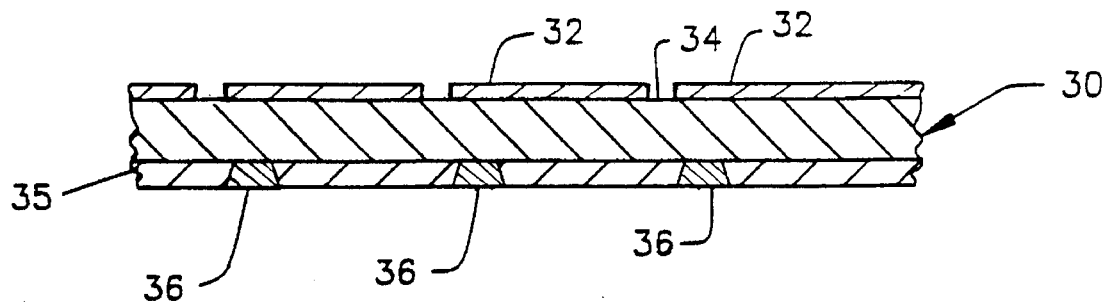
FIG. 2 is a diagrammatic, sectional view taken along line 2—2 in FIG. 1.

A process in accordance with one embodiment of the present invention begins with a top plate 30 of copper desirably about 20–200 microns thick and most preferably about 50 microns thick. Rectangular islands 32 are plated on the top surface of top plate 30. Each island is formed from one or more layers of etch-resistant metals, such as a layer of nickel about 2 microns thick and an overlayer of gold about 0.5 microns thick. Islands 32 may be applied by conventional, electroplating processes, using conventional photosensitive masking materials which are then removed. Each island preferably is about 0.5–2 mm and more preferably about 1 mm on a side. The islands 32 are separated from one another by gaps 34, desirably about 0.05 to 0.2 mm wide. As best seen in FIG. 1, the islands and gaps form a rectilinear grid. The rectilinear grid of islands 32 and gaps 34 extends in a lengthwise direction L and a transverse or widthwise direction W (FIG. 1). This grid covers the entire top surface of top sheet 30. Although fragmentary views such as FIGS. 1 and 2 illustrate only a few islands, it should be appreciated that the sheet may be of any size and that the sheet may incorporate any number of islands and associated features. For example, the sheet may be on the order of about 10–20 cm on a side, and may incorporate several thousand islands. Following deposition of the islands, a protective resist (not shown) is applied on the top surface of plate 40.

A solder mask layer 35 (FIG. 2) desirably about 10–50 microns thick, and most preferably about 25 microns thick, is applied to the bottom surface of top sheet 30. Layer 35 is formed from a flexible organic material of the type commonly employed as a photosensitive solder mask. Among suitable materials are flexible screen printable solder masks. Layer 35 is selectively patterned to form vias or apertures 36 and 38 extending through the layer, while leaving the remainder of the layer substantially intact. Layer 35 is patterned by a screen printing process in which the liquid material is printed onto the surface around the apertures and then cured by baking at 160° C. for 15 minutes. After the patterning process, the remaining material is a flexible, organic, polymer sheet. Vias 36 and 38 are rectangular in plan view, with the long dimension of the via extending in the widthwise direction W (FIG. 1) of the island array and the short dimension extending in the lengthwise direction L. The longer dimension of each via is slightly less than half the edge dimension of each island in the widthwise direction. Thus, in an arrangement as illustrated, where the islands are squares with 1 mm widthwise and lengthwise dimensions, the longer dimension of the via (in the widthwise direction W of the array) may be about 400–450 microns and most preferably about 450 microns. The shorter dimension of each via may be about 50–100 microns and most preferably about 75 microns. A first via 36 and a second via 38 are disposed beneath each island 32. The second via is offset from the first via in the lengthwise direction L, and in the widthwise direction W, so that the two vias are at opposite corners of the associated island.

In the next stage of the process, the vias 36 and 38 are filled with copper by electroplating. The resulting copper filler 37 desirably extends about 10 microns beyond the surface of polymeric layer or sheet 35. Using conventional electroplating techniques, the copper fillers in the vias are plated with coatings of nickel and gold, typically about 2 microns of nickel directly adjacent the copper filler and about 0.5 microns of gold upon the exposed surface.

Figure 3:
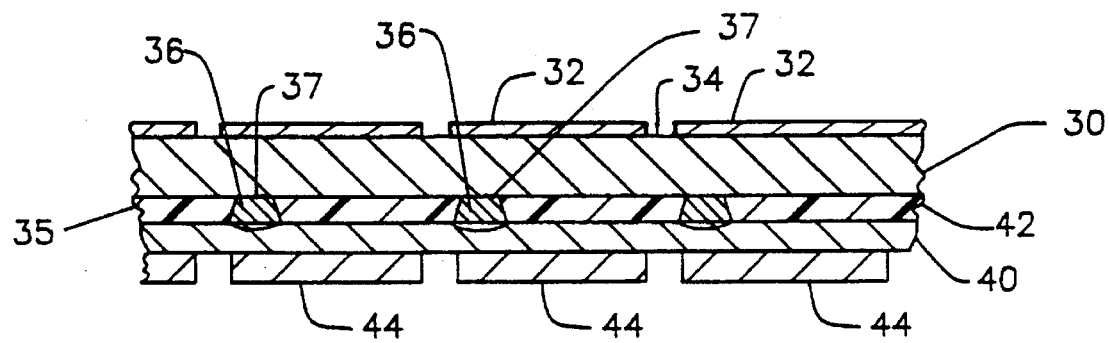
FIG. 3 is a view similar to FIG. 2 but depicting the components at a later stage of the process.

A copper plate 40, desirably about 50 microns thick is then laminated onto the bottom surface of the assemblage. Copper plate 40 desirably is a soft, oxygen and hydrogen-free ("OHFC") grade copper and desirably is in the fully annealed state when laminated. The copper plate bears a thin coating 42 of gold on its top surface. The lamination step is performed at a temperature of about 200° to about 280° C., and most preferably about 260° C., under pressure and for a time sufficient to produce a full cold weld between the filler 37 in each via and plate 40. In the next stage of the process a further photoresist is applied and developed using conventional photographic techniques to form rectangular pieces 44. Each piece 44 extends on the lower surface of sheet 40. Two pieces 44 are aligned with each island 32, the pieces extending parallel to one another in the longitudinal directions (from left to right and right to left in FIG. 3). The longitudinally extending pieces are disposed side-by-side so that only one piece aligned with each island 32 is visible in FIG. 3.

Figure 5:
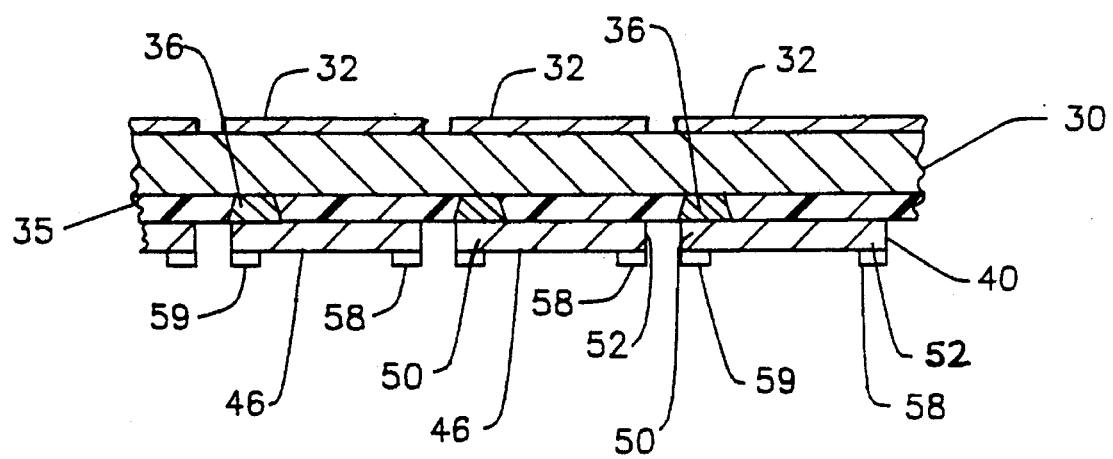
FIG. 5 is a diagrammatic sectional view taken along lines 5—5 in FIG. 4.
Figure 4:
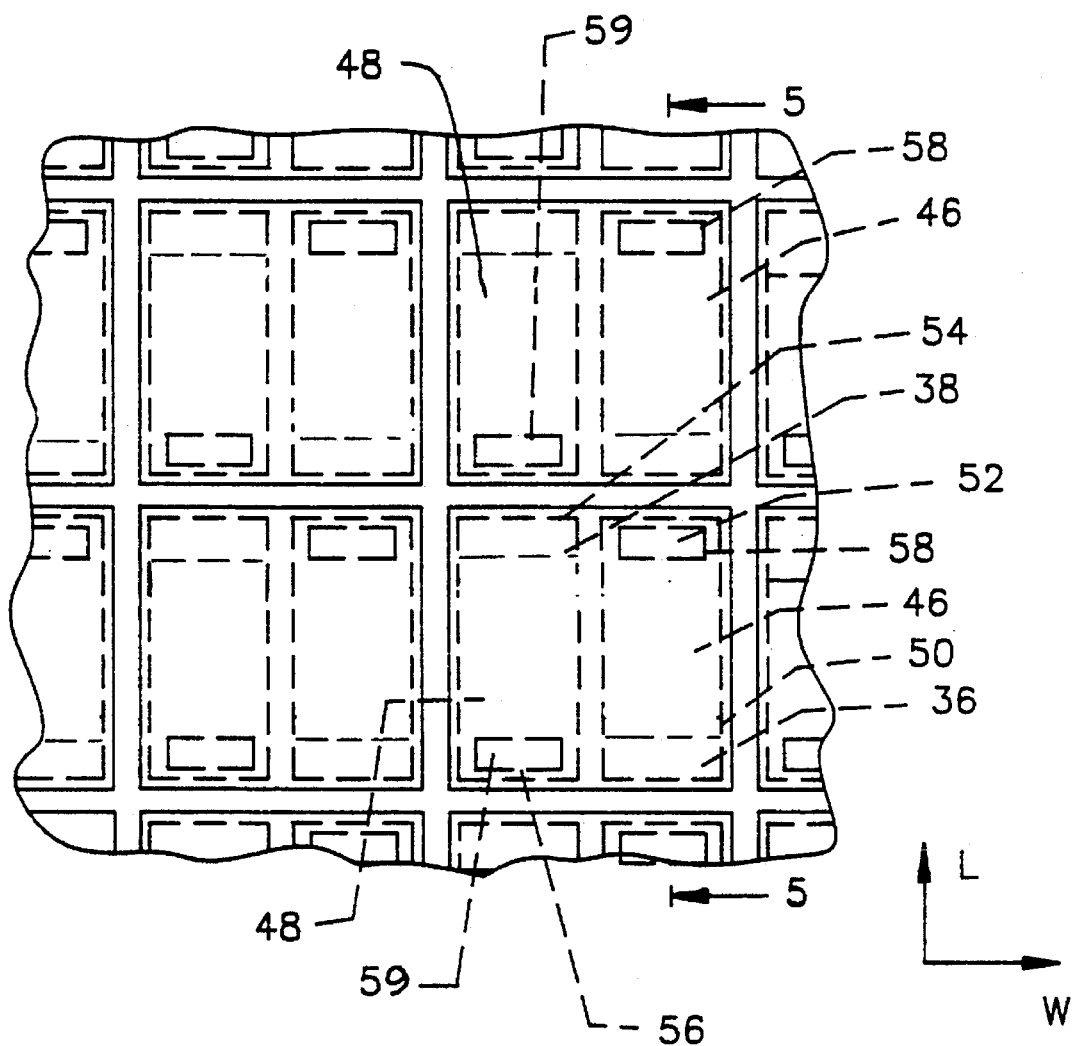
FIG. 4 is a view similar to FIG. 1 but depicting the components at a later stage of the process.

In the next stage of the process, sheet 40 is etched to form a plurality of individual strips 46 and 48 (FIGS. 4 and 5), the strips extending along the underside of polymeric sheet 35, remote from top plate 30. As best seen in FIG. 4, strip 46 is connected to the filler 37 in first via 36 and extends from the filled via in a first longitudinal direction, indicated by vector L. Thus, each first strip 46 has a via or fixed end 50 connected to top plate 30 by a filler in via 36 and a tip or free end 52 which is remote from via 36 and detached from top plate 30. The tip or free end of each first strip 46 is offset from the fixed or via end 50 of the same strip in the first longitudinal direction indicated by vector L in FIGS. 4 and 5. Conversely, each second strip 48 has a fixed or via end 54 and a free or tip end 56 arranged oppositely, so that the tip end 56 is offset from the fixed end 54 in the second, opposite longitudinal direction. The first strips 46 and second strips 48 are provided in a rectilinear grid extending in the lengthwise and widthwise directions. The grid includes rows of first strips 46 and rows of second strips 48, each such row extending in the lengthwise directions, the rows alternating with one another in the widthwise direction W of the grid, so that the first strip 46 and second strip 48 associated with each island 32 are offset from one another in the widthwise direction.

The length of each first and second strip is just slightly less than the lengthwise extent of the associated island, i.e., just slightly less than 1 mm in the arrangement illustrated, whereas the widthwise extent is slightly less than one-half of the widthwise dimension of the island, and desirably about the same as the long dimension of the associated via 36 or 38. The thickness or vertical dimension of each strip is equal to the original thickness of sheet 40, i.e., about 25 to about 100 microns and desirably about 50 to about 75 microns. Thus, the thickness of each strip is substantially less than the width or length of the strip. The thickness is greatly exaggerated in the drawings for clarity of illustration.

The tip ends of the first strips 46 are provided with bonding bumps or pads 58 of a bond-facilitating material such as gold, silver, tin, a lead-tin alloy, a copper-silver alloy, a tin-silver alloy, or a low temperature brazing material. Likewise, the second strips 48 are provided with bonding bumps or pads 59 at their free ends 56. This material may be applied either before or after formation of the individual strips, by electroplating or by other suitable techniques. Following this stage, the protective resist (not shown) applied on the top surface over the islands is removed. The strips 46 and 48 are allowed to oxidize by exposure to ambient air at room temperature or at elevated temperature. The bonding bumps 58 and 59 and islands 32 are substantially impervious to such oxidation.

Figure 6:
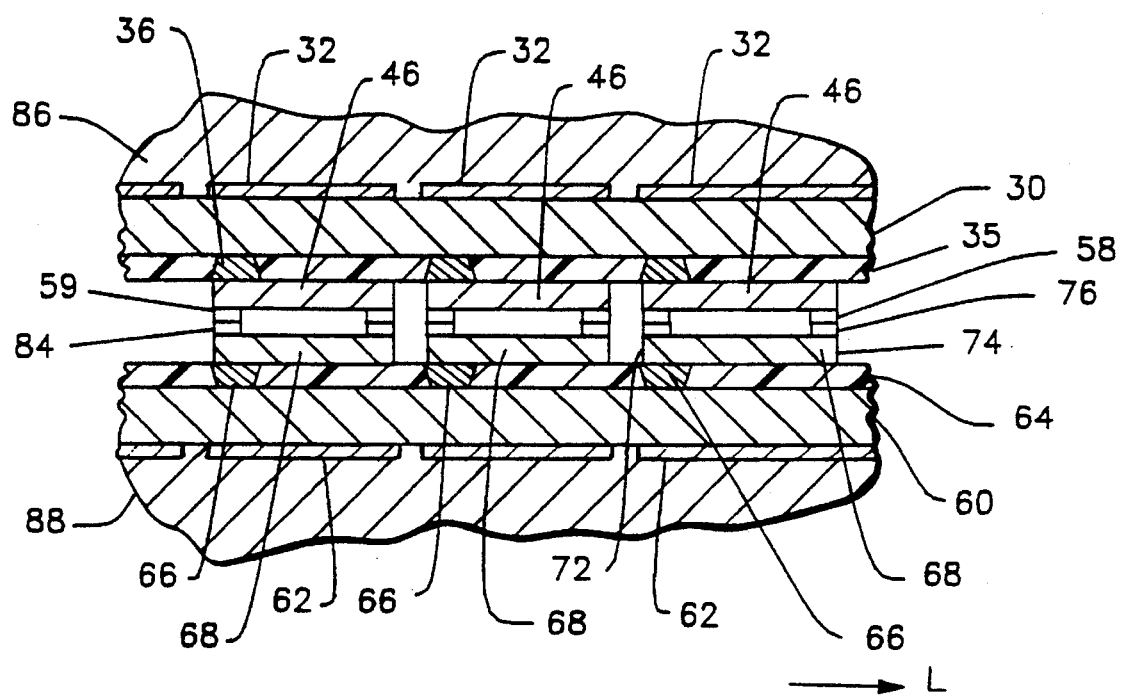
FIGS. 6 and 7 are views similar to FIG. 5 but depicting the components at later stages of the process.
Figure 7:
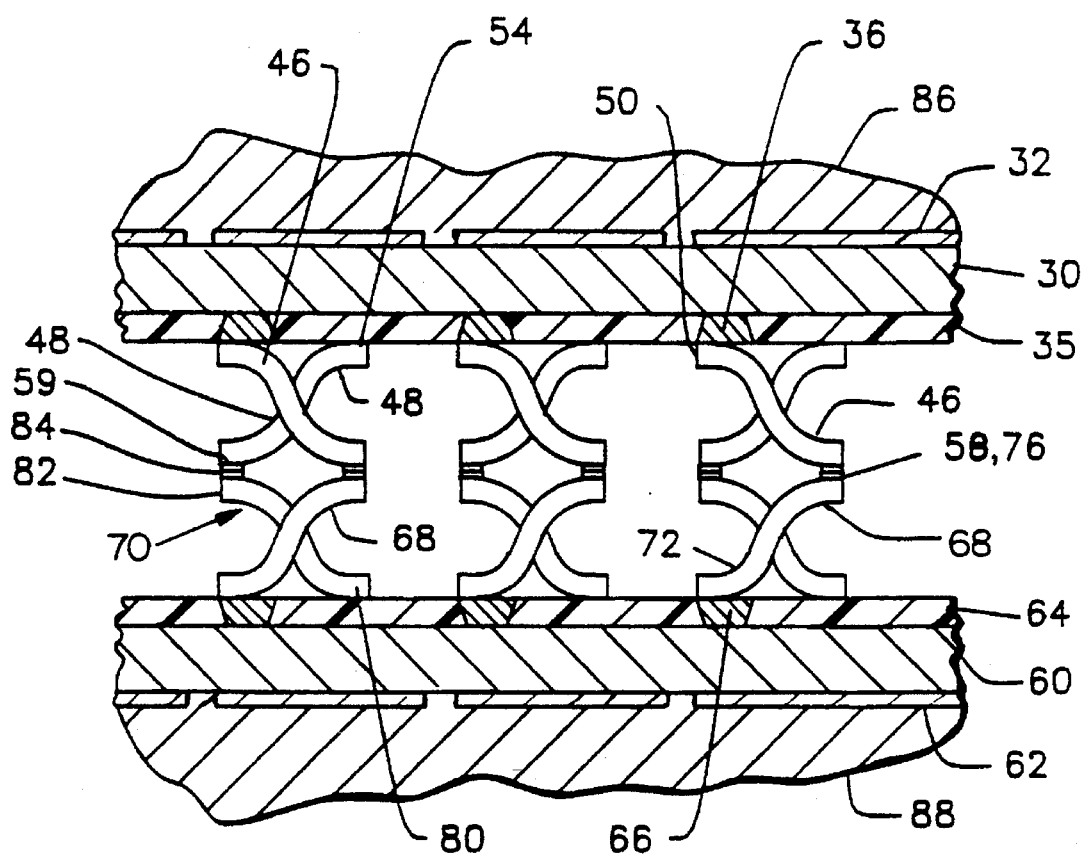

The same processes are repeated using a bottom plate 60 (FIG. 6), to thereby form a mirror-image but otherwise identical pattern including islands 62, a bottom flexible film 64 with first vias 66 and second vias (not shown) arranged in the same manner as the first and second vias 36 and 38 discussed above. The bottom sheet 60 is provided with first strips 68 and second strips 70 (FIG. 7). Here again, each first strip has a fixed end 72 attached to the bottom sheet 60 by the metal filling in the associated via 66 and a free end 74 detached from the sheet 60, the free end 74 being offset from the fixed end 72 in the first longitudinal direction L, to the right in FIG. 6. Each first strip 68 has a bonding material bump or pad 76 at its free end 74. Each second strip 70 (FIG. 7) has a fixed end 80 connected to sheet 60 and a free end 82 offset from fixed end 80 in the second longitudinal direction to the left as seen in FIGS. 6 and 7. Each such second strip associated with the lower sheet has a bonding material bump 84 at its second end.

The assembly including top plate 30 and its associated strips is overlaid on the bottom assembly including bottom plate 60 and its associated strips, in the position illustrated in FIG. 6. In this position, first strips 46 of the upper assembly overly first strips 68 of the bottom assembly. The first vias 36 and the fixed ends of the upper first strips 46 overly the first vias 66 and the corresponding fixed ends of the lower first strips 68. The free ends of the upper and lower first strips are aligned with one another, so that the bond bump 58 at the free end of each upper first strip 46 overlies and contacts the bond bump 76 at the free end of each lower first strip 68. Pressure is applied, as by squeezing the superposed assemblies between a pair of opposed platens 86 and 88 while heating the assemblies. The aligned and contacting bond bumps fuse with one another under the influence of heat and pressure, so as to form joints between the free ends of upper first strips 46 and lower first strips 68. Each such joint is offset in the first longitudinal direction (towards the right in FIG. 6) from the aligned fixed ends of the strips connected by such joint. In the same way, the aligned bond pads 59 and 84 at the free ends of the second strips 48 and 70 form joints between the upper and lower second strips, each such joint being offset in the opposite, second longitudinal direction (to the left in FIG. 6) from the fixed ends of the joined strips.

In the next stage of the process, upper plate 30, islands 32 and the associated flexible polymeric sheet 35 are moved upwardly, vertically away from lower plate 60, islands 62 and flexible sheet 64. The vertical movement is produced by injecting pressurized water, air or other fluid between plates 30 and 60, forcing the plates against flat platens 86 and 88, respectively, and forcing platens 86 and 88 apart. Alternatively, this vertical movement may be produced by moving platens 86 and 88 away from one another by external devices (not shown). In this case, plates 30 and 60 may be held against the platens by vacuum applied through ports in the platens. Alternatively or additionally, the sheets may be temporarily secured to the platens by a wax, an adhesive or any other suitable releasable bonding agent.

Figure 8:
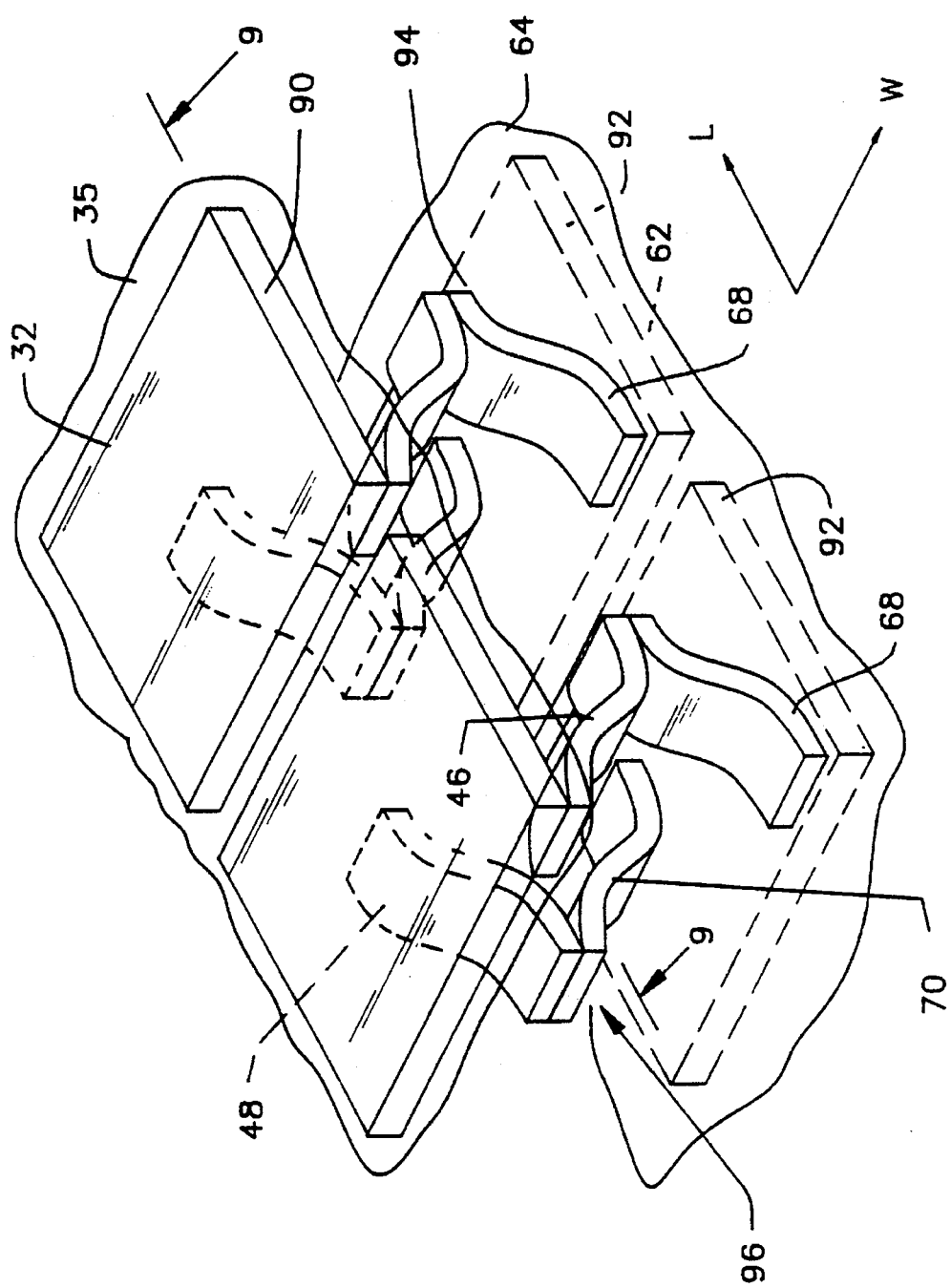
FIG. 8 is a fragmentary, diagrammatic perspective view depicting the thermal connector, made by the process of FIGS. 1–7.

As the upper and lower plates 30 and 60 move away from another, the strips are deformed into the three-dimensional, vertically expanded structure illustrated in FIGS. 7 and 8. The fixed end of each strip remains in position on the associated plate, whereas each strip bends vertically and horizontally. The joints between the strips move in the horizontal longitudinal directions towards the associated fixed ends, opposite to the direction of offset from the fixed end. Thus, the joint at the free ends of first strips 46 and 68 constituted by bond bumps 58 and 76, which was originally offset from the fixed ends and vias 36 and 66 in the first horizontal longitudinal direction (to the right in FIG. 7) moves in the opposite, second longitudinal direction, to the left in FIG. 7. Conversely, the joint between bond bumps 59 and 84 of the free ends of second strips 48 and 70, originally offset from the associated fixed ends 80 and 54 in the second longitudinal direction (to the left in FIG. 7) moves in the first longitudinal direction, to the right in FIG. 7. Thus, each joint moves longitudinally towards the fixed ends of the strips as the plates move away from one another. This causes each strip to bend into a doubly curved configuration resembling an elongated S-shape.

After the plates 30 and 60 are moved away from one another, they are released from the platens. The space between flexible sheets 35 and 64 is protected by providing a barrier (not shown) extending between sheets 35 and 64 around the periphery of these sheets. Alternatively or additionally, the space may be filled with a flexible, protective material such as a soft gel or paste, or with a temporary filler material that can be removed readily. The protective material may be provided as the pressurized fluid used to move the plates away from one another during the moving step, above. For example, an uncured liquid gel-forming material may be provided under pressure. After the space has been protected, the assembly is subjected to further etching, as by immersing the assembly in a hydrochloric acid and copper chloride etch solution. The gold islands 32 and 62 resist the etch solution, but the copper of plates 30 and 60 is attacked at the gaps between the islands. The etching step thus subdivides plate 30 into a plurality of upper or sink-side pads 90, and similarly subdivides bottom plate 60 into a plurality of lower or device-side pads 92. Pads 90 remain connected to one another by flexible sheet 35, but nonetheless are independently movable with respect to one another at least in the vertical directions (towards the top and bottom of the drawings in FIGS. 8 and 9) and, to a more limited extent, in the horizontal directions as well. Likewise, device-side pads 92 are independently movable, but are connected to one another by flexible sheet 64.

In this condition, each upper or sink-side pad is connected to a lower or device-side pad 92 by a first composite conductor 94 and a second composite conductor 96. Each such conductor has a lower or proximal end connected to the device-side pad 92 and an upper or distal end connected to the sink-side pad 90. Each first composite conductor 94 includes a lower strip or conductor 68 sloping generally upwardly and in the first horizontal longitudinal direction indicated by arrow L from the proximal end of the conductor to its juncture with the upper conductor 46. The upper conductor slopes in the opposite direction, upwardly and in the second longitudinal direction (opposite to arrow L) from the juncture with the lower conductor to the distal end of the composite conductor at the upper or sink-side pad 90. The lower conductor 68 of each first composite conductor includes a generally horizontally extending portion or lower crest 98 at the proximal end of the conductor and a further, horizontally extending medial crest 100 at the upper end of conductor 68, adjacent its juncture with upper conductor 46. Similarly, each upper conductor includes an upper crest 102 at the distal end of the conductor and a medial crest 104 at the lower end of the upper conductor, the upper conductor extending generally horizontally in both crests 102 and 104. The conductors are joined to one another at crest 100 and 104, adjacent the midpoint of the composite conductor 94.

Figure 9:
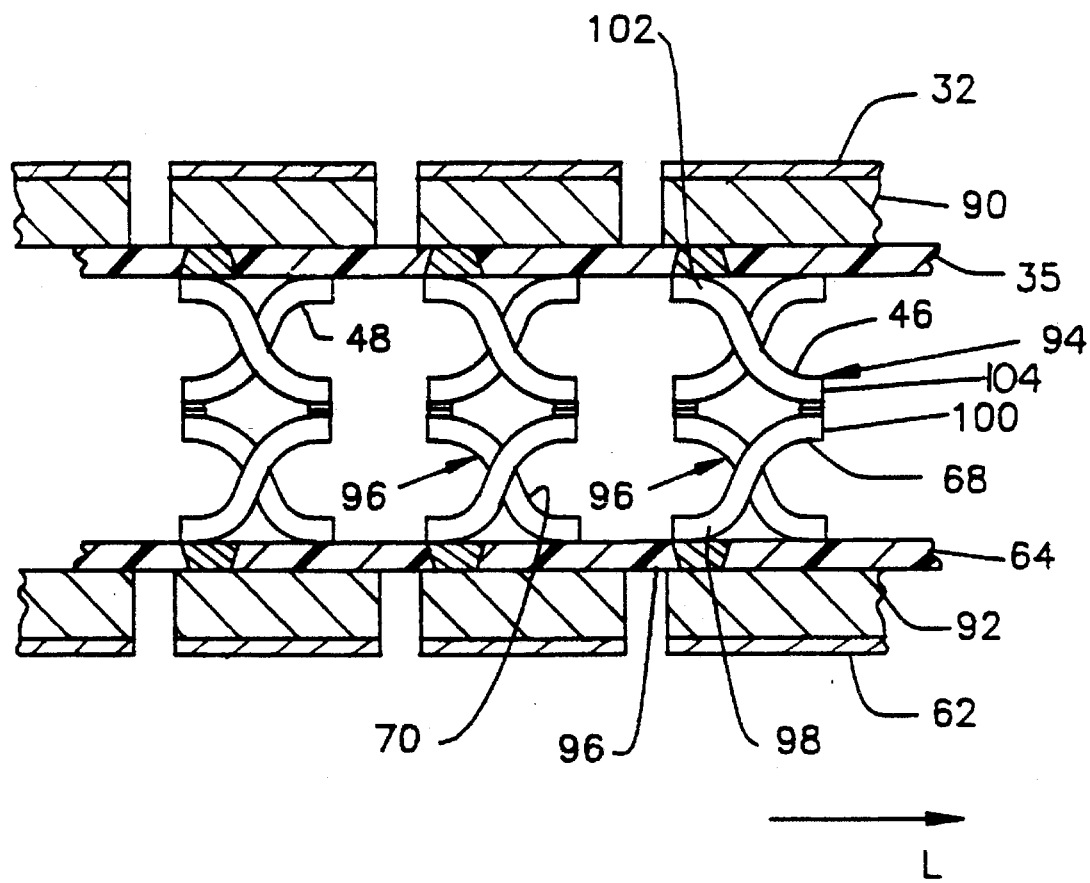
FIG. 9 is a diagrammatic sectional view taken along lines 9—9 in FIG. 8.

Each second conductor 96 has a similar but opposite construction, incorporating a lower conductor 70 and an upper conductor 48 which define lower and upper crests respectively and define medial crests at the juncture between the two conductors. However, in each second composite conductor 96, the lower conductor 70 slopes upwardly in the second horizontal longitudinal direction, opposite to arrow L in FIGS. 8 and 9 from the proximal end of the conductor at device-side pad 92 to its juncture with upper conductor 48, whereas each upper conductor 48 slopes downwardly in the second horizontal direction from the distal end at sink-side pad 90 to the juncture with the lower conductor. Thus, each first composite conductor 94 has the juncture of the upper and lower conductors displaced in the first longitudinal direction from the proximal and distal ends of the composite conductor whereas each second composite conductor 96 has the juncture displaced in the second, opposite, horizontal, longitudinal direction. As seen in FIGS. 8 and 9, each composite first conductor 94 is generally V-shaped, with the juncture of the upper conductor 46 and lower conductor 68 forming the point of the V-shape. Similarly, each composite second conductor 96 is generally V-shaped, with the juncture of upper conductor 48 and lower conductor 70 forming the point of the V-shape.

The first and second composite conductors are offset from one another in the widthwise horizontal direction indicated by arrow W in FIG. 8.

Each individual strip or conductor is doubly curved to form a generally s-shaped or quarter sinusoid structure, with the crests at the ends of the strips. The crests help to provide strong junctures between the upper and lower conductors, and between the conductors and the pads. The horizontally extending crests distribute bending stresses over large areas of the mating structures at the various junctures.

Figure 10:
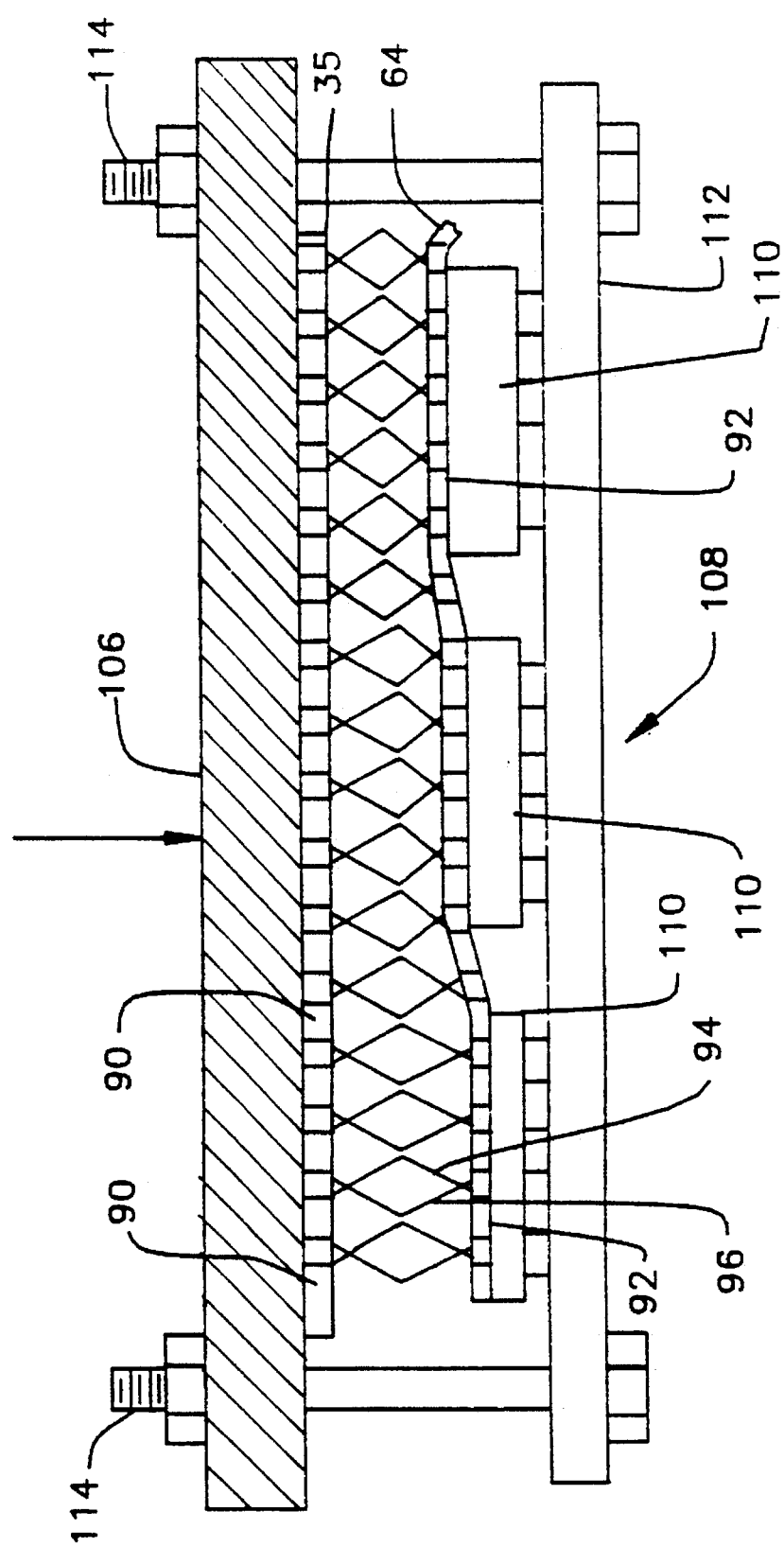
FIG. 10 is a diagrammatic, elevational view depicting the connector of FIGS. 8–9 in conjunction with other components.

In the next stage of the process, the upper or sink-side pads 90 and the associated islands 32 are bonded to a heat sink 106 (FIG. 10). The heat sink may be of any type, such as a thick plate adapted to conduct heat, a finned plate or shell adapted to shed heat to the surrounding atmosphere, or a conduit or vessel connected to an external source of a circulating cooling medium such as a liquid or gas. Heat sink 106 may also be a shell or package which encloses the semiconductor assembly. As used in this disclosure, the term "heat sink" includes any structural element which is adapted to absorb or dissipate the heat from an electronic assembly. The sink-side pads 90 conform with the surface of the heat sink despite curvatures or irregularities therein. Upper flexible sheet 35 bends to permit each pad 90 to lie against the surface of the heat sink. The pads 90 are bonded to the heat sink by conventional bonding materials, desirably metallic materials adapted to bond with the material of the heat sink and with the islands 32 covering the pads. Suitable bonding materials include solders, brazing alloys and diffusion bonding alloys. Other suitable bonding materials include metal-filled polymers such as epoxies. The bonding step may be performed by pressing the thermal conductor assembly including pads 90 and 92 and the composite conductors 94 and 96 against the surface of the heat sink after applying the bonding material to the heat sink, the pads or both and then heating the assembly to activate the bonding material. The temperatures attained in this process should not be so high as to damage the flexible sheets 35 and 64.

The subassembly including the heat sink and the thermal connector is then assembled with a microelectronic device 108 including a plurality of microelectronic components or chips 110 mounted on a substrate 112. The subassembly is engaged with the microelectronic device so that the device-side or lower pads 92 bear on components or chips 110. Sink 106 is urged towards substrate 112 and towards the microelectronic devices by any suitable mechanical clamping of device, schematically represented by bolts 114. Any other mechanical device capable of urging the elements towards one another may also be employed. Apart from the bolts shown, other suitable mechanical devices include crimped connectors holding the heat sink to the substrate. The crimped connectors may be integral with the substrate and/or the heat sink and may form a package surrounding the microelectronic elements.

As the elements are engaged with one another, the device-side or lower pads 92 are urged towards the sink-side or upper pads 90, causing composite conductors 94 and 96 to deform. As each composite conductor bends, the juncture between the upper and lower conductor constituting such composite conductor is displaced outwardly, in horizontal longitudinal directions. Although this bending action may involve appreciable vertical forces, it does not tend to move the pads horizontally. Thus, any horizontal force generated by one composite conductor attached to a given device-side pad 92 is substantially counterbalanced by the force generated from flexure of the other composite conductor connected to the same device-side pad. The lower flexible sheet 64 deforms so that each pad 92 can move independently, thereby allowing all of the pads to conform with the devices 110 even where the devices lie at differing distances from heat sink 106 and even where the faces of the devices are not parallel to the heat sink.

To promote intimate thermal contact between the device-side pads 92 and the microelectronic components, the pads, the devices or both may be coated with a thermally conductive liquid, paste or other flowable medium, such as a gel, an oil or a liquid metal, to provide a low-resistance thermal path between the components and the path which can be disassembled if necessary. Alternatively, the device-side pads can be permanently bonded to the microelectronic devices by a solder, by a metal-filled polymer such as an epoxy, or by a low-melting glass frit or other suitable bonding material. Bonding materials of the type commonly employed for die attachment or mounting chips on substrates can be used.

During operation of the microelectronic device, the microelectronic components or chips evolve heat. Heat is conducted from the chips through pads 92, composite conductors 94 and 96 and sink-side pads 90. Because the thermal connector provides substantially continuous metallic paths, and because the strips constituting the composite conductors may have substantial cross-sectional areas, the devices may have substantial conductivity. In operation, the substrate 112, components 110 and heat sink 106 may expand and contract as their respective temperatures change, causing the chip surfaces to move vertically, towards and away from the heat sink, and in the horizontal directions. The composite conductors provide substantial compliance or flexibility in all three directions. That is, the curved composite conductors can flex to allow vertical movement and also to allow movement in the longitudinal and widthwise directions L and W (FIG. 8). Flexure of the conductors does not tend to apply severe horizontal or sharing forces to the chips and hence does not tend to detach the chips from the substrate.

Figure 11:
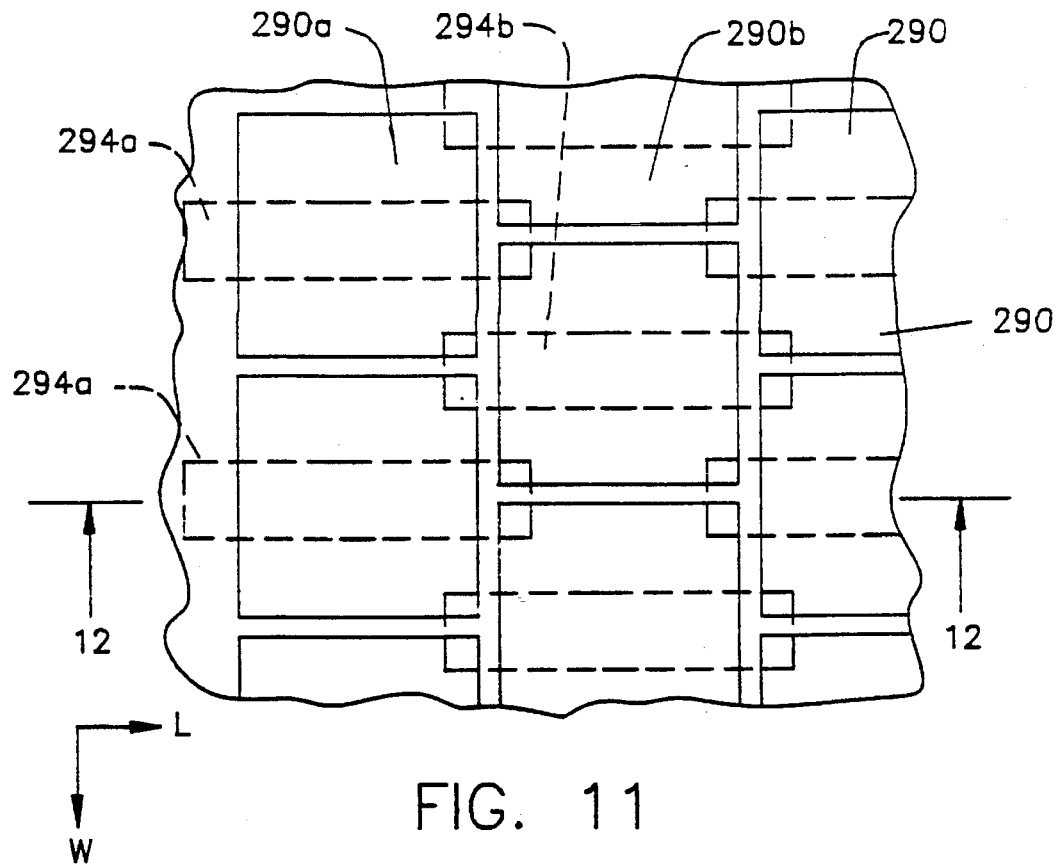
FIG. 11 is a fragmentary, diagrammatic plan view depicting a component in accordance with a further embodiment of the invention.
Figure 12:
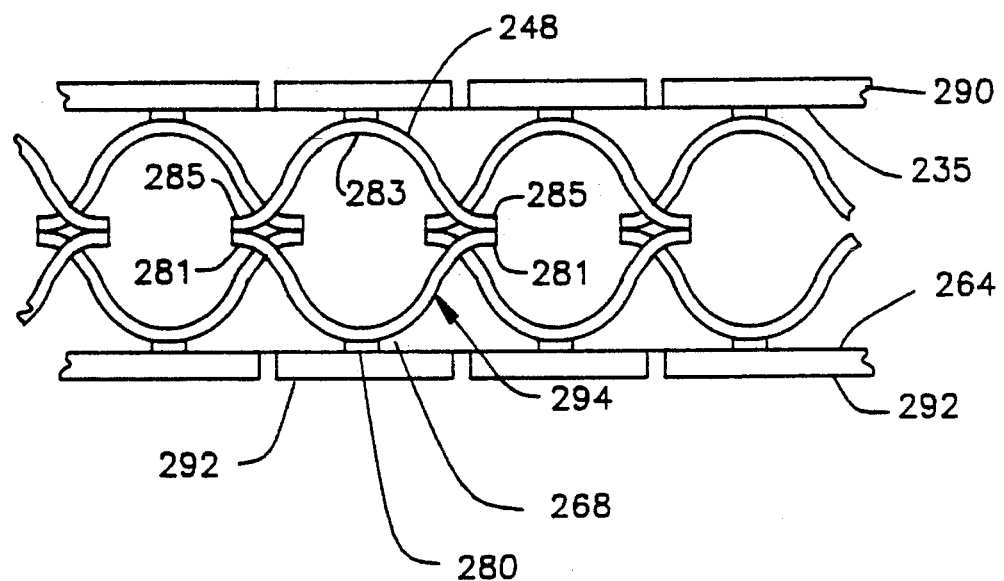
FIG. 12 is a fragmentary, diagrammatic sectional view taken along line 12—12 in FIG. 11.

A connector in accordance with a further embodiment of the invention is illustrated in FIGS. 11 and 12. This connector includes upper or sink-side pads 290 and lower or device-side pads 292. Here again, the sink-side pads are connected to one another by a flexible sheet 235 whereas the device-side pads 292 are connected to one another by another flexible sheet 264. The sink-side and device-side pads are again arranged in rectilinear arrays extending in lengthwise and widthwise horizontal directions. However, the sink-side pads 290 are arranged in a staggered array, with alternate rows being offset from one another in the widthwise direction W of the array. Thus, rows of first sink-side pads 290a alternate with rows of second sink-side pads 290b, each first pad being offset in the widthwise direction from the adjacent second pad by about one-half the widthwise direction of the pads. The device-side pads 292 are disposed in the same pattern. Each sink-side pad is disposed directly over one device-side pad in alignment therewith.

Each pair of aligned sink-side and device-side pads is connected to one another by a loop-like composite conductor 294. Each conductor 294 includes a lower conductor 268 and an upper conductor 248. Each lower conductor 268 has a single lower crest 280 connected to the associated device-side pad 292 through a via in sheet 264. Each lower conductor includes an elongated strip having a thickness substantially as discussed above, the thickness dimension of each such strip facing generally in the vertical direction. Each such lower conductor or strip has two generally S-shaped runs joined at lower crest 280 and extending in opposite, longitudinal directions (to the left and right in FIG. 12) from the lower crest 280. Each such lower conductor curves upwardly, transversely to its thickness in both oppositely extending runs. Each run terminates at a medial crest 281, the strip or conductor extending generally horizontally in such medial crest. Each upper conductor includes a single, upper crest 284 joined to the sink-side pad 290 through an aperture in the flexible film 235 and forming the distal end of the composite connector. Each upper connector 248 has two generally S-shaped runs joined at upper crest 283 and extending in opposite longitudinal directions from the upper crest 283. These runs curve downwardly away from the upper crest. Each upper conductor terminates in a pair of medial crests 285, in which the conductor extends generally horizontally. The medial crests 281 and 285 of the upper and lower conductors are bonded to one another.

The lower and upper crests 280 and 283 constituting the proximal and distal ends of each composite conductor 294 are aligned with the centers of the pads. Thus, each composite conductor 294*a* associated with a sink-side pad 290*a* in a first row is aligned in the widthwise direction with the center of that pad. Each such conductor is aligned with the edges of pads 290*b* in the next adjacent second row. Conversely, each connector 294*b* associated with a pad 290*b* in the second row is aligned widthwise with the pad 294*b* and hence is aligned with the edges of first pads 290*a*. Thus, the composite connectors 294*a* and 294*b* are staggered widthwise with respect to one another. Even though each composite connector extends lengthwise beyond the edges of the associated pad, the connectors do not interfere with one another. Connectors in accordance with FIGS. 11 and 12 can be fabricated by substantially the same procedures as discussed above, with changes in the patterning of the various photoresist and etching steps. These connectors can be used in substantially the same way as the connectors discussed above. The loop-like composite conductors provide inherently balanced horizontal forces. As the associated device-side and sink-side pads move towards and away from one another, the horizontal forces exerted by different portions of the connector protruding in opposite, horizontal, longitudinal directions balance one another. Each composite conductor provides compliance in the vertical direction and also provides compliance in horizontal, widthwise and longitudinal directions.

Figure 13:
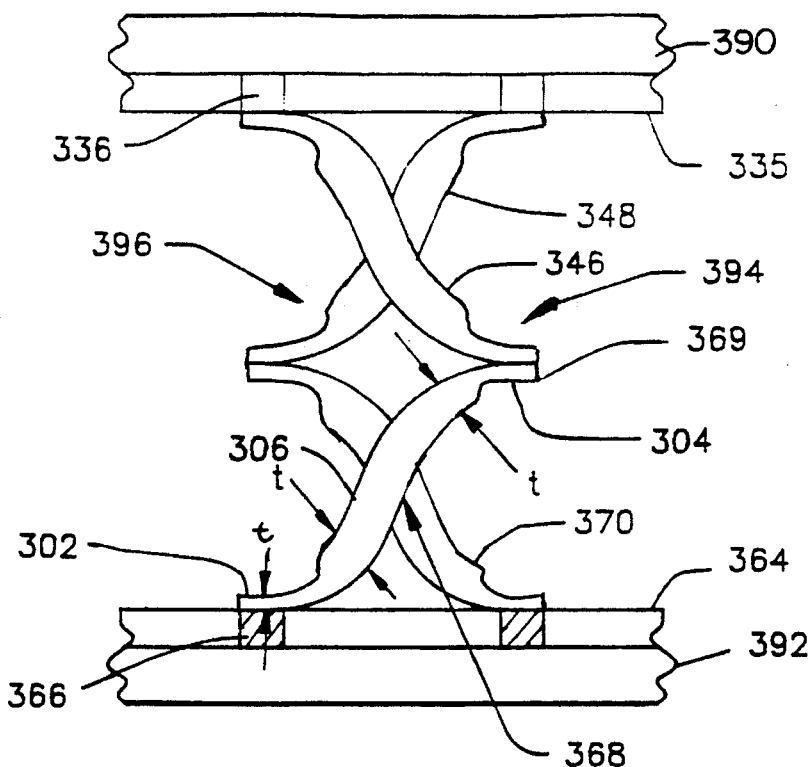
FIG. 13 is a fragmentary, diagrammatic, elevational view depicting a connector in accordance with a further embodiment of the invention.

A portion of a connector in accordance with a further embodiment of the present invention is depicted in FIG. 13. This conductor includes a multiplicity of sink-side pads 390 and a multiplicity of device-side pads 392, only one of each pad being visible in the fragmentary view. The device-side pads 392 are connected to one another by a flexible sheet 364, whereas the sink-side pads are connected to one another by a flexible sheet 335. Each pair of pads is connected by two composite conductors 394 and 396. Here again, each composite conductor includes two generally S-shaped strips. Thus, first composite conductor 394 includes a lower strip 368 extending from the proximal end to its juncture with upper strip 346. The upper strip extends from the distal end to the medial joint 369 of the composite conductor. In this arrangement as well, each second composite conductor 396 includes a lower conductor 370 and an upper conductor 348 similar to the corresponding components of the first composite conductor 394 but extending in the opposite longitudinal directions.

In the embodiment of FIG. 13, each of the conductors or strips incorporated in the composite conductors has a neck adjacent each end. Thus, lower conductor 368 includes a first neck 302 adjacent its lower or proximal end and a second neck 304 adjacent the medial joint 369 of the composite conductor, i.e., adjacent the upper end of strip or conductor 368. Each of these necks encompasses only a minor portion of the length of the conductor. Desirably, the neck sections of each conductor together encompass less than about 20 percent of the length of the conductor and more desirably about 5 percent of the conductor length. Thus, the remainder or major region 306 of the conductor occupies the major portion of the conductor length. The thickness dimension t of the conductor in the neck portions is substantially smaller than the corresponding thickness t in the major portion 306. Desirably, the thickness in the necks is about 10 to about 50 percent of the thickness in the main region. The thickness may be substantially constant within each neck and within the major region. The width of the conductor, i.e., the dimension perpendicular to the thickness and the length and hence perpendicular to the plane of the drawing in FIG. 13, is substantially equal in the neck regions 302 and 304 and in the major region 306.

Because the thickness of each neck region is substantially less than the thickness of each major region, the neck regions are substantially more flexible than the major regions 306 with respect to bending in the thickness direction of the strip, i.e., transverse to the faces of the strip. Although the reduced thickness also tends to increase the thermal resistance of the strip, the increase in thermal resistance is far less than proportionate to the increase in flexibility. When conductor or strip 368 is stressed in bending, as occurs during vertical displacement of the pads 392 and 390 relative to one another, the bending moments are at maximum adjacent the ends of the strips. Thus, the neck regions are disposed in the areas of the strip exposed to the highest bending moment. Therefore, a moderate reduction in the moment of inertia or stiffness of the necks results in a large increase in the deflection of the strip in bending per unit force applied to bend it. Stated another way, a small reduction in the stiffness of the neck regions results in a large decrease in the spring constant of the strip relative to forces tending to bend the strip and hence a large increase in the compliance of the strip or conductor.

Because the moment of inertia and stiffness in bending in the thickness direction is proportional to the third power of the thickness, only a modest difference in thickness between the neck region and the major region results in a substantial difference in moment of inertia and stiffness between these regions. By contrast, the thermal resistance of the neck section is inversely proportional to the first power of the thickness. Moreover, the effect of the neck thickness on the overall thermal resistance of the conductor varies substantially linearly with the ratio between the length of the necks and the length of the entire conductor. Therefore, provided that the neck encompasses only a minor portion of the length, the thickness or cross-sectional area of the neck has only a minor impact on the overall thermal resistance. For all of these reasons, conductors such as conductor 368 incorporating one or more necks provide combinations of relatively low spring constant and high compliance with relatively low thermal resistance and high thermal conductivity unattainable in comparable conductors of uniform thickness. As illustrated in FIG. 13, the upper conductor 346 joined with conductor 368 in composite conductor 394 has similar necks, as do the conductors constituting the other composite conductor 396. The effects discussed above with reference to conductor 368 are reproduced in these other individual conductors and in the composite conductors.

Conductors of non-uniform thickness as illustrated in FIG. 13 can be fabricated and incorporated in the thermal connector by processes substantially the same as those discussed above. Either before or after etching the sheet 40 (FIG. 3) to form the individual strips or conductors, the sheet can be selectively etched at the locations which are to form the necks. Alternatively, the sheet or the individual strips formed from the sheet may be provided in the thickness corresponding to the thickness of the neck sections, and then selectively plated to provide additional thickness in the major regions.

Figure 14:
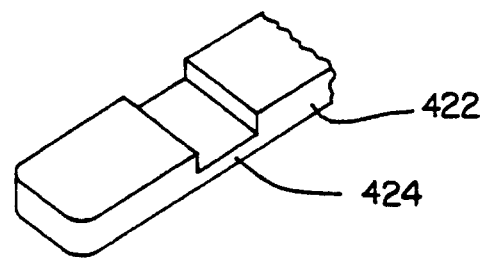
FIGS. 14, 15, 16 and 17 are fragmentary perspective views depicting portions of conductors in accordance with further embodiments of the invention.
Figure 15:
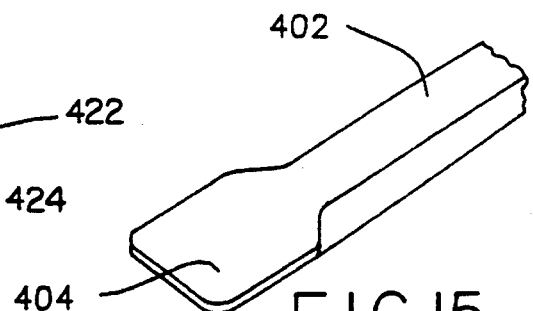
Figure 16:
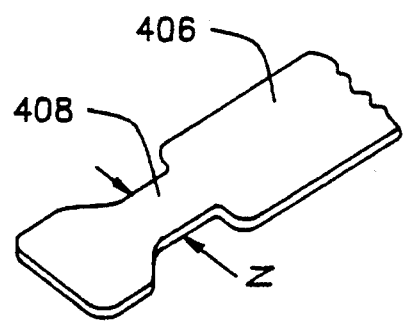
Figure 17:
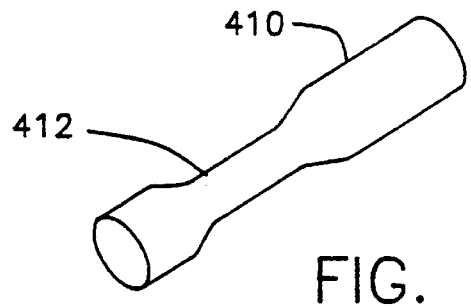

Numerous variations and combinations of the features discussed above can be provided with departing from the present invention. Merely by way of example, the conductor partially illustrated in FIG. 14 has a major region 422 and a neck region 424 of reduced thickness. The neck region 424 is not at the end of the conductor, but instead forms a notch within the conductor, close to the end. The end has same thickness as the major region. The conductor shown in FIG. 15 incorporates a major region 402 and a neck 404, the neck region 404 being wider than the major region 402 but thinner than the major region. Thus, although the cross sectional areas of both the major region and the neck are the same, the moment of inertia and hence the stiffness of the neck in bending transverse to the thickness is less than that of the major region. The conductor of FIG. 16 has a neck 408 and a major region 406 of the same thickness, the neck region having a smaller width Z than the major region. This arrangement is somewhat less preferred inasmuch as the moment of inertia in bending transverse to the thickness only decreases linearly with the width Z and hence a greater reduction in cross-sectional area of the neck 408, and a greater reduction in thermal conductivity, are required to achieve the same reduction in stiffness. However, the conductor as illustrated in FIG. 16 can be fabricated without any additional selective plating or etching of the metal sheet or conductors; the same pattern etching step which forms the conductors will also form the neck. As illustrated in FIG. 17, the conductors may be round, each conductor including a major region 410 having a first diameter and a neck region 412 having a smaller diameter.

In a process according to a further embodiment, an upper plate 500 and lower plate 502 are connected to strips 504. Each strip has a proximal end 506 connected to the lower sheet 502 and a distal end 508 connected to the upper sheet 500. The proximal ends of all of the strips are offset from the distal ends in the same longitudinal direction, to the right as seen in FIG. 18. After formation of the strips and attachment of the strips to plates 500 and 502, the plates are moved vertically away from one another, so as to move the proximal ends downwardly relative to the distal ends. At the same time, the lower plate 502 is moved in the longitudinal direction opposite to the original direction of offset, i.e., to the left in FIG. 18. The combined downward and longitudinal motion is generally as indicated by the arrow M in FIG. 18. This movement bends each strip 504 into a curved, generally S-shaped conductor as indicated in FIG. 19. The plates 500 and 502 may be subdivided into individual sink-side pads 510 and device-side pads 513, the sink-side pads being connected to one another by flexible sheet 512, the device-side pads being connected by a flexible sheet 514. Each such S-shaped conductor has a lower bight or curve at one end of the S-shape forming a crest adjacent the device-side pad 513. Likewise, each S-shaped conductor has an upper bight or curve at the other end of the S-shape defining an upper crest 507 adjacent sink-side pad 510. Here again, each lead is connected to the associated pads by metallic fillers extending through vias in the flexible sheets. In this arrangement as well, the flexible sheets are essentially imperforate apart from the openings filled by the connections of the leads. This facilitates encapsulation or filling of the space between the pads. In the embodiment of FIG. 19, each pair of pads is connected to one another by only one conductor. Therefore, as the pads move towards and away from one another, and the sloping leads bend, there will be some horizontal thrust applied to the pads. However, where the leads are relatively long and thin, this force is minimized.

According to further embodiments of the invention, the strips or conductors 600 (FIG. 20) initially may be curved in one or both horizontal directions. Such curved strips may be nested or contained within one another as illustrated in FIG. 20. Each strip may have a proximal end 602 connected to the lower or device-side plate (not shown) and a distal end 604 connected to the upper or sink-side plate (also not shown), these differently connected ends being disposed in an alternating arrangement as depicted in FIG. 20. In the moving step, the device-side and sink-side plates may move vertically away from one another, causing the distal ends 604 to rise relative to the proximal ends 602 to the positions shown in FIGS. 21 and 22. The increased distance between the distal and proximal ends of each strip is accommodated by straightening of the initial horizontal bend. At the same time, each strip may bend in vertical directions, transverse to its thickness. In this arrangement, each pair of adjacent strips forms a balanced pair, with alternate strips being inclined in opposite directions, as depicted in FIG. 22. When the device-side and sink-side sheets are severed to form pads 606 and 608, each pad is left connected to one conductor extending generally in each longitudinal direction. This arrangement provides generally balanced forces on the pads when the conductors are deformed. Desirably, deformation of the conductors forms each conductor into a generally S-shaped unit as discussed above.

In the embodiment of FIG. 23, each device-side pad 706 is connected to the corresponding sink-side pad 708 by a composite lead 700 incorporating several substantially coextensive conductive elements 710. Each element 710 is a strip or ribbon having major surfaces 712, the ribbons being superposed on one another so that major surfaces 712 confront one another. The ribbons are bonded to one another by bonding material 714 at the proximal end of the conductor, adjacent device-side pad 706, and at the distal end of the conductor adjacent the sink-side pad 708.

In the middle of the conductor, remote from the ends, the ribbons are not bonded to one another and are free to move relative to one another. Preferably, the unbonded region extends over the major portion of the conductor length. The composite conductor is formed into a generally S-shaped configuration as discussed above, and hence each ribbon is also generally S-shaped, with the curves of the S-shape being transverse to the major surfaces of the ribbons.

The composite conductor has a thermal conductivity substantially equal to the sum of the conductivities of the individual ribbons or elements 710, and thus equal to the thermal conductivity of a unitary conductor having thickness equal to the sum of the thicknesses of the ribbons. However, the stiffness of the composite conductor is far less than the stiffness of such a unitary conductor. In other respects, the connector of FIG. 23 operates in the same way as the connectors discussed above. Composite conductors can be made in other configurations as, for example, in the loop-like configuration of FIGS. 11–12 and the configuration of FIGS. 20–22. Also, the composite conductors may include neck sections, in which one or more of the individual ribbons constituting the conductor have reduced stiffness. In a further variant, one or more of the individual elements may be interrupted in the neck section of a composite conductor, so that the stiffness of the conductor as a whole is reduced in the neck section. In such an arrangement, the individual elements may be connected to one another at the border of the neck section to facilitate cross-conduction of heat between the elements. Thus, as shown in FIG. 24, one or more elements 812 may extend throughout the length of the lead, whereas other elements 813 may extend over only a portion of the lead. The lead thus defines neck sections 815 of reduced thickness where elements 813 are missing. Elements 813 are bonded to element 815 at joints 816 adjacent the neck sections, whereas element 813 is bonded to the device-side and sink side plates. In a further variant, each composite conductor may include plural elements other than striplike ribbons as, for example, a plurality of rods or wires.

Numerous modifications of the features described above can also be used. In one such modification, the order of steps is changed so that the device-side and sink-side sheets are severed to form the individual pads before the sheets are moved away from one another. Thus, the individual pads themselves are pulled away from one another to deform the conductors. In a further variant, the sink-side pads can be omitted and all of the conductors can be directly joined to the heat sink. Thus, the conductors can be formed on the surface of the heat sink itself, so that the heat sink replaces the sink-side plate in the formation process. The step of subdividing the sink-side plate is omitted in such a process. The device-side pads can also be omitted where the conductors can be bonded to the microelectronic components or formed on the microelectronic components. In a further variant, the conductors are bonded to the microelectronic components and to the heat sink, without any intermediate sheets or pads and the sink and the components are moved away from one another. In a further variant, the thermal connector can be applied to the microelectronic components or chips while the chips are in a wafer stage. Thus, a wafer containing a multiplicity of chips may be bonded to the pads or conductors of a large thermal connector and the wafer may then be severed to form individual chips, each bearing a portion of the thermal connector. Such a connector-equipped chip can be engaged with heat sink. In one embodiment of such a process, the conductors of the thermal connector may be formed on the surface of the wafer and bonded to the sink-side sheet, or to the heat sink, either before or after severing the wafer to form chips. Alternatively, an individual chip can be equipped with the thermal connector and then attached to a substrate and subsequently engaged with heat sink. In further variants, the space within the thermal connector around the conductors can be filled with a thermally conductive or nonconductive paste, fluid, gel, elastomer or other compliant material which is confined by the flexible device-side sheet together with the flexible sink-side sheet or the heat sink itself. This material may be injected under pressure in the moving step, so that the pressurized compliant material moves the sink-side and device-side elements away from one another. Alternatively, the space between the sheets surrounding the conductors, may be connected to a source of cooling fluid so that the cooling fluid passes through the space continually during operation.

As these and other variations and combinations of the features described can be utilized without departing from the present invention, the foregoing description of the preferred embodiments should be taken as a way of illustration rather than by way of limitation of the invention as set forth in the claims.

What is claimed is:

1. A thermal connector for a microelectronic assembly comprising:
   (a) a device-side element and a sink-side element spaced apart from one another in a vertical direction; and
   (b) a plurality of conductive paths each including one or more elongated conductors, each said path having a proximal end fixed to said device-side element and a distal end fixed to said sink-side element, said conductors in said paths sloping in first and second lengthwise horizontal directions opposite to one another, said conductors being arranged in one of more arrays extending in said lengthwise horizontal directions and also extending in widthwise horizontal directions transverse to said lengthwise horizontal directions, each said array including a substantially equal numbers of conductors sloping in said first and second lengthwise directions, said conductors being flexible so as to permit movement of said device-side element relative to said sink-side element.

2. A thermal connector for a microelectronic assembly comprising:
   (a) a device-side element and a sink-side element spaced apart from one another in a vertical direction; and
   (b) a plurality of conductive paths each including one or more elongated conductors, each said path having a proximal end connected to said device-side element and a distal end connected to said sink-side element, said conductors in said paths sloping in first and second lengthwise horizontal directions opposite to one another, said conductors being arranged in one or more arrays extending in said lengthwise horizontal directions and also extending in widthwise horizontal directions transverse to said lengthwise horizontal directions, each said array including a substantially equal numbers of conductors sloping in said first and second lengthwise directions, each said path including a plurality of said conductors connected substantially end to end so that the conductors in each said path slope alternately in said first and second lengthwise directions, said paths including a plurality of paths of a first type in which a conductor at the proximal end of the path slopes in said first lengthwise direction and a plurality of paths of a second type in which the conductor at the proximal end of the path slopes in said second direction, the number of paths of said second type being substantially equal to the number of paths of said first type.

3. A thermal connector as claimed in claim 1 wherein said device-side element includes a plurality of device-side pads, each said pad being connected to at least one said path and being movable independently of the other said pads.

4. A thermal connector as claimed in claim 3 wherein said device-side pads are arranged in a grid extending in lengthwise and widthwise horizontal directions.

5. A thermal connector as claimed in claim 4 further comprising a flexible sheet connecting said device-side pads to one another.

6. A thermal connector as claimed in claim 3 wherein each said pad is connected to an even number of said conductors, with equal numbers of said conductors sloping in opposite lengthwise directions.

7. A thermal connector as claimed in claim 1 wherein each said conductor is substantially S-shaped.

8. A thermal connector for a microelectronic assembly comprising:
   (a) a device-side element and a sink-side element spaced above the device-side element; and (b) a lower array of conductors each including an elongated thermally conductive strip having opposite major faces directed generally in vertical directions towards said device-side and sink-side elements, each said conductor curving in said vertical directions, and defining a lower crest at which the strip extends substantially horizontally, the lower crest of each said conductor being attached to said device-side element, said conductors of said lower array also being connected to said sink-side element for transmission of heat thereto; and (c) an upper array of conductors, each said conductor of said upper array including an elongated thermally conductive strip having opposite major faces directed generally in said vertical directions, each said upper array conductor curving in said vertical directions, and defining an upper crest at which the strip extends substantially horizontally, the upper crest of each said conductor being attached to said device-side element, said conductors of said lower array being thermally connected to said sink-side element through said conductors of said upper array.

9. A connector as claimed in claim 8 wherein each said conductor of said upper array is directly attached to at least one said conductor of said lower array, so that said attached conductors define substantially continuous paths extending between said device-side and sink-side elements.

10. A connector as claimed in claim 9 wherein said conductors of both said arrays define medial crests remote from said device-side and sink-side elements, said strips extending substantially horizontally at said medial crests, said conductors of said upper and lower arrays being attached to one another at said medial crests, the strips constituting the attached conductors overlying one another in substantially face-to-face arrangement.

11. A connector as claimed in claim 10 wherein said overlying strips are metallurgically bonded to one another at said medial crests.

12. A connector as claimed in claim 9 wherein each said conductor is substantially S-shaped and defines the crests of such conductor adjacent opposite ends such S-shape, each such S-shaped conductor having a sloping section between the crests of the conductor, each said conductor of said upper array being connected to one said conductor of the lower array to form one said path, each said path including one conductor sloping in a first horizontal direction and another conductor sloping in a second, opposite horizontal direction.

13. A connector as claimed in claim 12 wherein some of said paths are first-type paths having said lower conductor sloping in said first horizontal direction and said upper conductor sloping in said second horizontal direction and offers of said paths are second-type paths having said lower conductor sloping in said second horizontal direction and said upper conductor sloping in said first horizontal direction.

14. A connector as claimed in claim 13 wherein said device-side element includes a plurality of pads independently movable with respect to one another, each said pad being connected to equal numbers of paths of the first and second types.

15. A thermal connector for a microelectronic device comprising:

(a) a plurality of thermally conductive device side pads disposed in an array extending in horizontal directions;

(b) a flexible device-side sheet connecting said device-side pads so that said pads are movable relative to one another but said sheet forms a substantially fluid-tight barrier between adjacent pads; and (c) a plurality of elongated flexible thermal conductors connected to said pads and extending therefrom whereby said device-side pads can be thermally connected to a heat sink through said thermal conductors.

16. A connector as claimed in claim 15 wherein each said device side pad has a proximal side and a distal side, said device side sheet extending on said distal sides of said device side pads, said device side sheet having a proximal side facing toward said device side pads and a distal side facing away from said device side pads, said device side sheet also having apertures extending through the device side sheet, said conductors being disposed on the distal side of the device side sheet and being connected to said device side pads through said apertures in said device side sheet.

17. A connector as claimed in claim 16 wherein each said conductor includes a strip having a major surface confronting the distal side of the device side sheet at one said aperture, the strip curving upwardly away from the device side sheet.

18. A connector as claimed in claim 17 wherein each said strip is substantially S-shaped.

19. A connector as claimed in claim 17 further comprising thermally conductive fillers extending through said apertures between said strips and said pads, each said filler being bonded to the associated pad and strip.

20. A connector as claimed in claim 15 further comprising a plurality of sink side pads disposed in a horizontally-extending array spaced vertically from said device-side pads, said conductors extending between said device-side pads and said sink-side pads.

21. A thermal connector for a microelectronic device comprising a device-side element and a sink-side element spaced apart from one another in a vertical direction and a plurality of generally v-shaped conductors connected between said elements, each said v-shaped conductor having one end attached to the device-side element and the other end attached to the sink-side element, so that the point of the v lies between the elements, the point of each v-shaped conductor being offset from the ends of such conductor in a horizontal longitudinal direction, some of said conductors being first conductors, the point of each first conductor being offset in a first longitudinal direction, others of said conductors being second conductors, the point of each second conductor being offset in a second longitudinal direction opposite to said first longitudinal direction.

22. A connector as claimed in claim 21 wherein said device-side element includes a plurality of device-side pads, each said device-side pad having equal numbers of said first and second conductors connected thereto.

23. A thermal connector for a microelectronic device comprising a device-side element, a sink-side element and a plurality of conductive paths extending between said elements, each said path including a plurality of substantially S-shaped flexible thermal conductors connected in series so that heat passing between said device-side element and said sink-side element through each said path will flow through one said thermal conductor and then through another said thermal conductor.

24. A thermal connector as claimed in claim 23 wherein said device side and sink side elements are spaced apart from one another in a vertical direction, each said S-shaped conductor including a crest at each end of the conductor and a section sloping horizontally and vertically between the crests, the conductors of each said path being joined crest-to-crest, sloping sections of different conductors in each said path sloping in different horizontal directions.

* * * * *

UNITED STATES PATENT AND TRADEMARK OFFICE
CERTIFICATE OF CORRECTION

PATENT NO. : 5,557,501
DATED : September 17, 1996
INVENTOR(S) : DeStefano, et. al.

It is certified that error appears in the above-indentified patent and that said Letters Patent is hereby corrected as shown below:

Column 21, line 51, "offers" should read --others--.

Signed and Sealed this

Nineteenth Day of November, 1996

Attest:

BRUCE LEHMAN

*Attesting Officer*     *Commissioner of Patents and Trademarks*